(12) United States Patent
Nishida et al.

(10) Patent No.: US 11,594,412 B2
(45) Date of Patent: Feb. 28, 2023

(54) METHOD OF MANUFACTURING SEMICONDUCTOR DEVICE, SUBSTRATE PROCESSING APPARATUS, AND RECORDING MEDIUM

(71) Applicant: KOKUSAI ELECTRIC CORPORATION, Tokyo (JP)

(72) Inventors: Keigo Nishida, Toyama (JP); Takashi Ozaki, Toyama (JP); Atsushi Hirano, Toyama (JP)

(73) Assignee: KOKUSAI ELECTRIC CORPORATION, Tokyo (JP)

(*) Notice: Subject to any disclaimer, the term of this patent is extended or adjusted under 35 U.S.C. 154(b) by 130 days.

(21) Appl. No.: 16/828,280

(22) Filed: Mar. 24, 2020

(65) Prior Publication Data

US 2020/0312655 A1 Oct. 1, 2020

(30) Foreign Application Priority Data

Mar. 28, 2019 (JP) .............................. JP2019-063107

(51) Int. Cl.
*H01L 21/00* (2006.01)
*H01L 21/02* (2006.01)
(Continued)

(52) U.S. Cl.
CPC .. *H01L 21/02312* (2013.01); *C23C 16/45563* (2013.01); *H01L 21/0228* (2013.01); *H01L 21/67109* (2013.01)

(58) Field of Classification Search
CPC ............. H01L 21/0228; H01L 21/0214; C23C 16/45563; C23C 16/45546; C23C 16/45523; C23C 16/455
See application file for complete search history.

(56) References Cited

U.S. PATENT DOCUMENTS

2010/0218724 A1* 9/2010 Okada ................... C23C 16/00
                                                         118/724
2014/0357058 A1  12/2014 Takagi et al.
(Continued)

FOREIGN PATENT DOCUMENTS

JP      2011-249407 A    12/2011
JP      2014-063959 A     4/2014
(Continued)

OTHER PUBLICATIONS

Search Report dated Oct. 23, 2020 for Singapore Patent Application No. 10202002578V.
(Continued)

*Primary Examiner* — Reema Patel
(74) *Attorney, Agent, or Firm* — Volpe Koenig

(57) ABSTRACT

There is provided a technique that includes: (a) arranging a plurality of first substrates and a second substrate having a smaller surface area than the first substrates and accommodating the plurality of first substrates and the second substrate in a process chamber; and (b) forming a thin film on each of the plurality of first substrates by supplying a processing gas to a substrate arrangement region in which the plurality of first substrates and the second substrate are arranged, wherein (b) includes: (c) supplying a dilution gas to a first supply region of the substrate arrangement region, or not performing a supply of the dilution gas to the first supply region, and supplying the dilution gas to at least one second supply region of the substrate arrangement region at a flow rate larger than a flow rate of the dilution gas supplied to the first supply region.

14 Claims, 11 Drawing Sheets

(51) Int. Cl.
*H01L 21/67* (2006.01)
*C23C 16/455* (2006.01)

(56) References Cited

U.S. PATENT DOCUMENTS

| | | | |
|---|---|---|---|
| 2015/0275366 A1* | 10/2015 | Fukushima | C23C 16/45557 438/778 |
| 2016/0289833 A1 | 10/2016 | Okada et al. | |
| 2017/0067159 A1 | 3/2017 | Isobe et al. | |
| 2017/0298508 A1 | 10/2017 | Yamakoshi et al. | |

FOREIGN PATENT DOCUMENTS

| | | |
|---|---|---|
| JP | 2014-123616 A | 7/2014 |
| JP | 2014-236129 A | 12/2014 |
| JP | 2016-192528 A | 11/2016 |
| WO | 2016/110956 A1 | 7/2016 |

OTHER PUBLICATIONS

Written Opinion dated Oct. 23, 2020 for Singapore Patent Application No. 10202002578V.
Japanese Office Action dated Aug. 3, 2021 for Japanese Patent Application No. 2020-047250.

\* cited by examiner

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION(S)

This application is based upon and claims the benefit of priority from Japanese Patent Application No. 2019-063107, filed on Mar. 28, 2019, the entire contents of which are incorporated herein by reference.

TECHNICAL FIELD

The present disclosure relates to a method of manufacturing a semiconductor device that processes a substrate, a substrate processing apparatus, and a recording medium.

BACKGROUND

As a process of manufacturing a semiconductor device, a process of supplying a processing gas to a plurality of substrates and forming a thin film on each of the substrates is performed in some cases.

SUMMARY

Some embodiments of the present disclosure provide a technique capable of controlling the inter-substrate film thickness distribution of thin films formed on a plurality of substrates.

According to one or more embodiments of the present disclosure, there is provided a technique that includes: (a) arranging a plurality of first substrates and a second substrate having a smaller surface area than the first substrates in a direction perpendicular to a surface direction and accommodating the plurality of first substrates and the second substrate in a process chamber; and (b) forming a thin film on each of the plurality of first substrates by supplying a processing gas to a substrate arrangement region in which the plurality of first substrates and the second substrate are arranged, wherein (b) includes: (c) supplying a dilution gas to a first supply region, which includes a region where at least a part of the plurality of first substrates are arranged and does not include a region where the second substrate is arranged, of the substrate arrangement region, or not performing a supply of the dilution gas to the first supply region, and supplying the dilution gas to at least one second supply region, which is a region other than the first supply region and includes the region where the second substrate is arranged, of the substrate arrangement region at a flow rate larger than a flow rate of the dilution gas supplied to the first supply region.

BRIEF DESCRIPTION OF DRAWINGS

The accompanying drawings, which are incorporated in and constitute a part of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

One or More Embodiments of the Present Disclosure

Hereinafter, embodiments (first embodiments) of the present disclosure will be described with reference to FIGS. 1 to 5, FIG. 9, and the like.

(1) Configuration of Substrate Processing Apparatus

Figure 1:
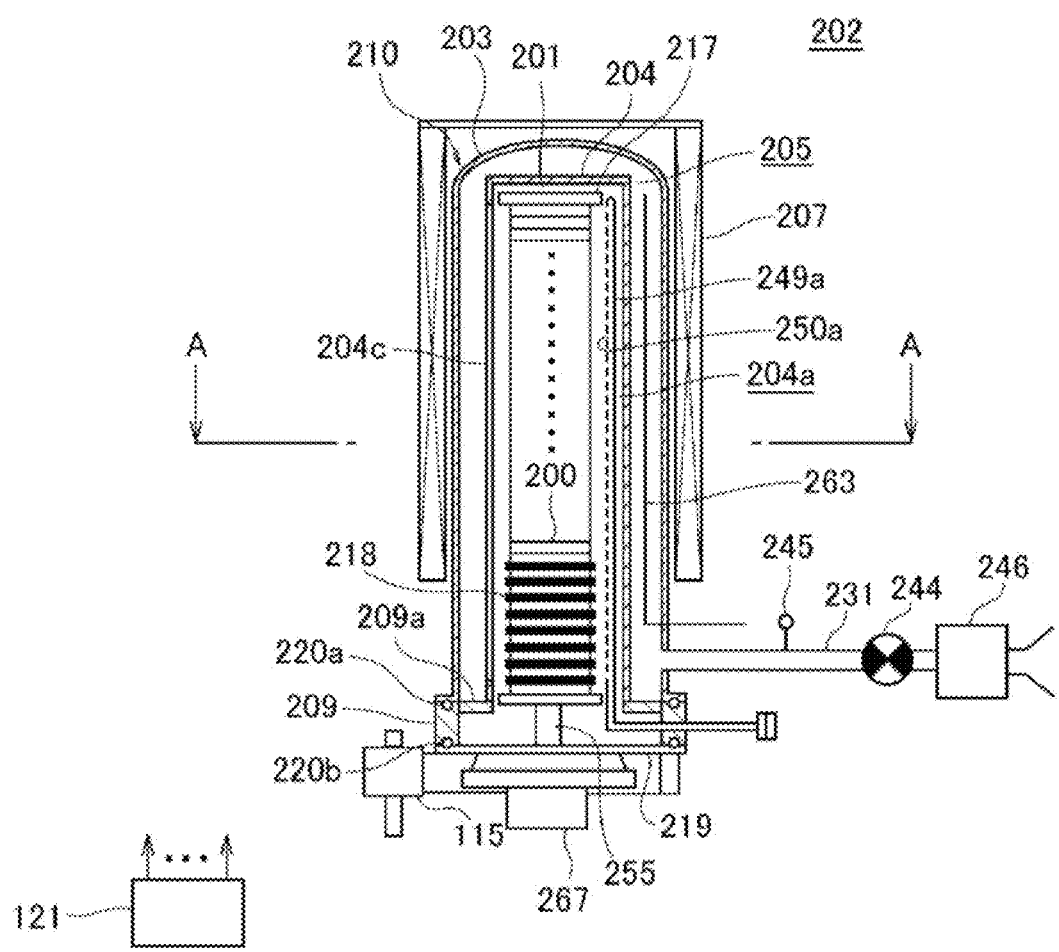
FIG. 1 is a schematic configuration diagram of a vertical process furnace of a substrate processing apparatus suitably used in embodiments of the present disclosure, in which a diagram of the process furnace is shown in a vertical sectional view.

As shown in FIG. 1, a process furnace 202 includes a heater 207 as a heating mechanism (temperature adjustment part). The heater 207 has a cylindrical shape and is vertically installed by being supported on a holding plate. The heater 207 also functions as an activation mechanism (excitation part) that thermally activates (excites) a gas.

Inside the heater 207, a reaction tube 210 is disposed concentrically with the heater 207. The reaction tube 210 has a double-tube configuration including an inner tube 204 as an internal reaction tube and an outer tube 203 as an external reaction tube concentrically surrounding the inner tube 204. Each of the inner tube 204 and the outer tube 203 is made of a heat-resistant material such as quartz ($SiO_2$) or silicon carbide (SiC), and is formed in a cylindrical shape having a closed upper end and an open lower end.

A process chamber 201 in which a process to wafers 200 as substrates is performed is formed in the hollow portion of the inner tube 204. The process chamber 201 is configured to accommodate the wafers 200 in a state in which the wafers 200 are arranged from one end side (lower side) to the other end side (upper side) in the process chamber 201 along a direction perpendicular to the surface direction of the wafers 200. A region where the wafers 200 are arranged in the process chamber 201 is also referred to as a substrate arrangement region (wafer arrangement region). The direction in which the wafers 200 are arranged in the process chamber 201 is also referred to as a substrate arrangement direction (wafer arrangement direction).

The inner tube 204 and the outer tube 203 are respectively supported from below by a manifold 209. The manifold 209 is made of a metal material such as stainless steel (SUS) or the like, and is formed in a cylindrical shape with upper and lower ends opened. At the upper end portion of the inner wall of the manifold 209, there is installed an annular flange 209a made of a metal material such as SUS or the like and extending radially inward of the manifold 209. The lower end of the inner tube 204 makes contact with the upper surface of the flange 209a. The lower end of the outer tube 203 makes contact with the upper end of the manifold 209. An O-ring 220a as a sealing member is installed between the outer tube 203 and the manifold 209. The lower end opening of the manifold 209 is configured as a furnace port of the process furnace 202, and is hermetically sealed by a disc-shaped seal cap 219 as a lid when a boat 217 is raised by a boat elevator 115 described below. An O-ring 220b as a seal member is installed between the manifold 209 and the seal cap 219.

The ceiling of the inner tube 204 is formed in a flat shape, and the ceiling of the outer tube 203 is formed in a dome shape. If the ceiling of the inner tube 204 is formed in a dome shape, the gas supplied into the process chamber 201 easily flows into the internal space of the dome portion of the ceiling of the inner tube 204 without flowing between the wafers 200. By forming the ceiling of the inner tube 204 into a flat shape, the gas supplied into the process chamber 201 can efficiently flow between the wafers 200. By reducing the clearance (space) between the ceiling of the inner tube 204 and the top plate of the boat 217 described below, for example, by making the size of the clearance approximately equal to the arrangement interval (pitch) of the wafers 200, it is possible to allow a gas to efficiently flow between the wafers 200.

Figure 2:
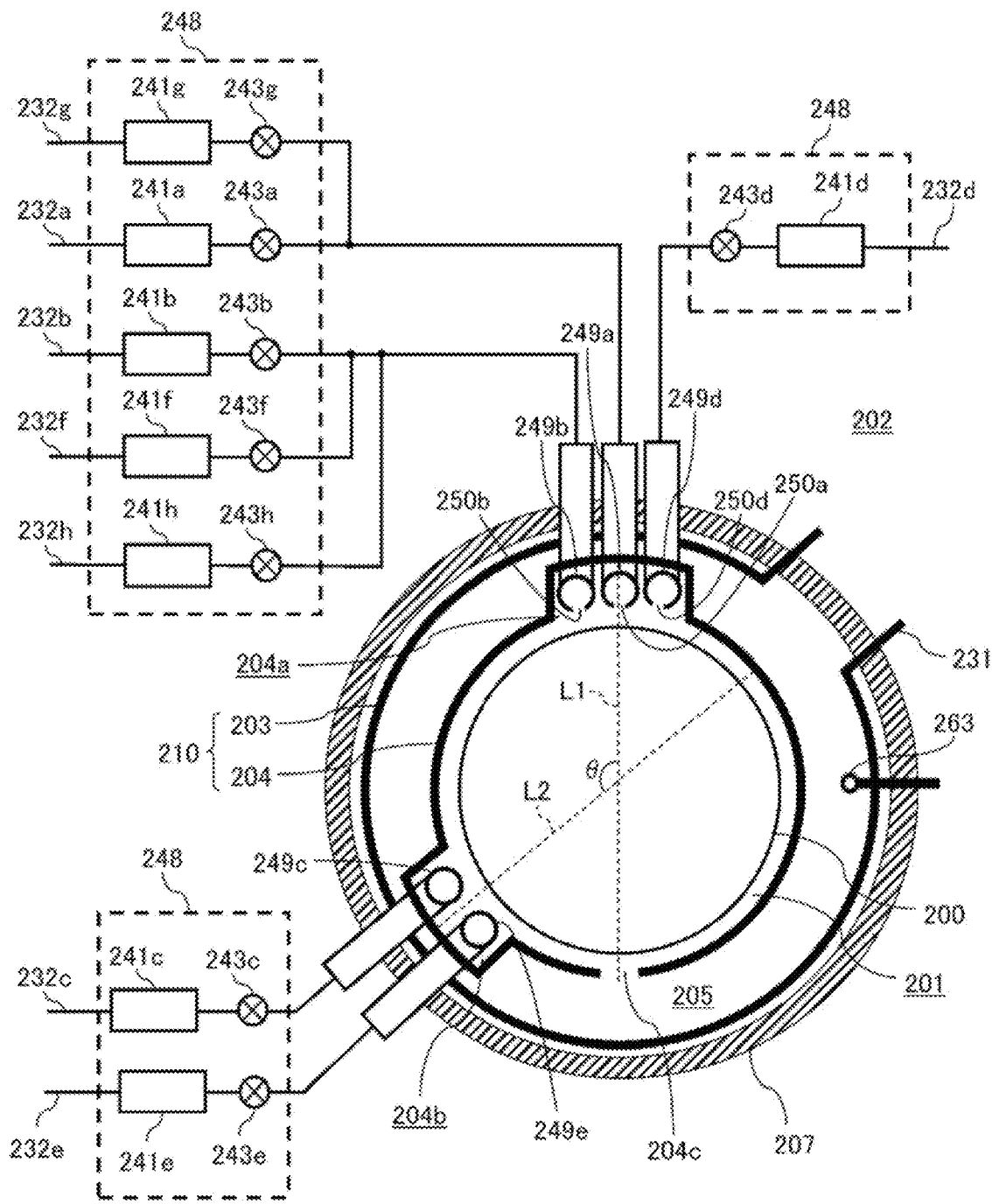
FIG. 2 is a schematic configuration diagram of the vertical process furnace of the substrate processing apparatus suitably used in embodiments of the present disclosure, in which a diagram of the process furnace is shown in a sectional view taken along line A-A in FIG. 1.

As shown in FIG. 2, at the side wall of the inner tube 204, there are formed a nozzle accommodation chamber 204a for accommodating nozzles 249a, 249b, and 249d and a nozzle accommodation chamber 204b for accommodating nozzles 249c and 249e. Each of the nozzle accommodation chambers 204a and 204b is formed in a channel shape that protrudes radially outward from the side wall of the inner tube 204 and extends in the vertical direction. Each of the inner walls of the nozzle accommodation chambers 204a and 204b constitutes a part of the inner wall of the process chamber 201. The nozzle accommodation chamber 204a and the nozzle accommodation chamber 204b are respectively arranged at positions separated from each other by a predetermined distance along the inner wall of the inner tube 204, i.e., along the outer peripheries of the wafers 200 accommodated in the process chamber 201. More specifically, the nozzle accommodation chambers 204a and 204b are respectively arranged at such positions that the central angle θ (the center angle with respect to an arc having both ends at the respective centers of the nozzle accommodation chambers 204a and 204b) formed by a straight line L1 connecting the center of the wafers 200 accommodated in the process chamber 201 to the center of the nozzle accommodation chamber 204a and a straight line L2 connecting the center of the wafers 200 accommodated in the process chamber 201 to the center of the nozzle accommodation chamber 204b is set to an angle falling within a range of, for example, 30 to 150°. The nozzles 249b and 249d accommodated in the nozzle accommodation chamber 204a are arranged at both sides of the nozzle 249a so as to sandwich the nozzle 249a, i.e., arranged along the inner wall of the nozzle accommodation chamber 204a (the outer peripheral portions of the wafers 200) so as to sandwich the nozzle 249a from both sides thereof. In the present specification, the nozzles 249a and 249b are also referred to as R1 and R2, respectively, and the nozzles 249c, 249d, and 249e are also referred to as Rt, Rc, and Rb, respectively. The nozzles 249c to 249e are also referred to as Rt to Rb.

Figure 9:
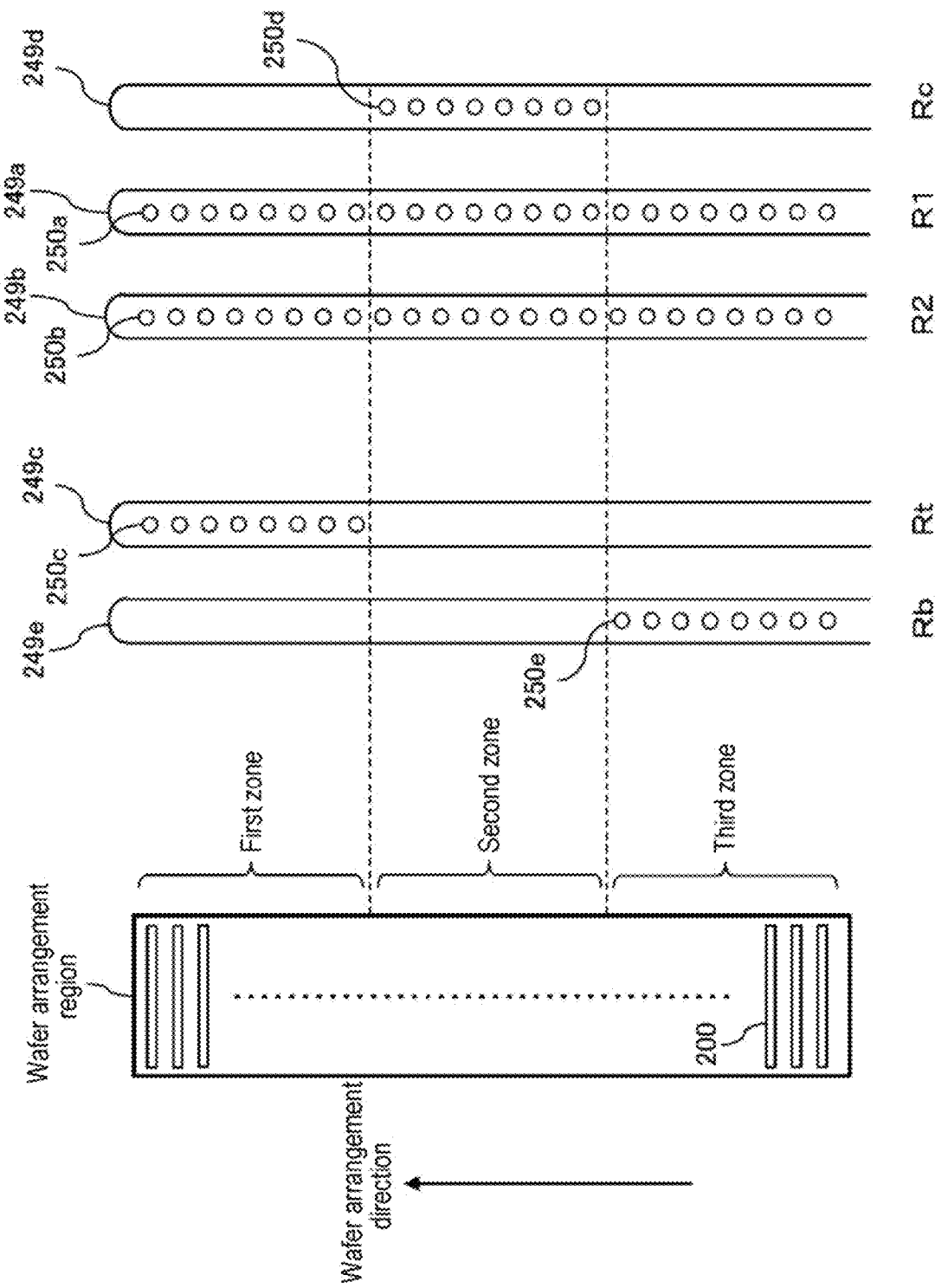
FIG. 9 is a schematic configuration diagram of nozzles suitably used in embodiments of the present disclosure.

The nozzles 249a to 249e are respectively installed so as to extend upward from the lower portions of the nozzle accommodation chambers 204a and 204b to the upper portions thereof, i.e., in the wafer arrangement direction. In other words, the nozzles 249a to 249e are respectively installed in the regions horizontally surrounding the wafer arrangement region on the side of the wafer arrangement region so as to extend along the wafer arrangement region. As shown in FIG. 9, gas discharge holes 250a to 250e as first to fifth gas supply holes are installed at the side surfaces of the nozzles 249a to 249e, respectively. The nozzles 249a to 249e are made of, for example, a heat-resistant material such as quartz or SiC.

As shown in FIG. 9, the aforementioned wafer arrangement region may be divided into a plurality of zones. In the present embodiments, the zone at one end side (here, the upper side) of the wafer arrangement region in the wafer arrangement direction is also referred to as a first zone (top zone). The zone at the center of the wafer arrangement region in the wafer arrangement direction is also referred to as a second zone (center zone). The zone at the other end side (here, the lower side) of the wafer arrangement region in the wafer arrangement direction is also referred to as a third zone (bottom zone).

The gas discharge holes 250a and 250b of the nozzles 249a and 249b are installed from the upper portions to the lower portions of the nozzles 249a and 249b so as to correspond to the entire region of the wafer arrangement region in the wafer arrangement direction. The nozzles 249a and 249b, i.e., R1 and R2 are configured to supply a gas to all of the first to third zones, respectively.

The gas discharge holes 250c of the nozzle 249c are installed only at the upper portion of the nozzle 249c so as to correspond to the upper region of the wafer arrangement region in the wafer arrangement direction, i.e., the first zone. The nozzle 249c, i.e., Rt, is configured to supply a gas to the first zone and not to perform the supply of a gas to other zones, i.e., the second and third zones.

The gas discharge holes 250d of the nozzle 249d are installed only at the central portion of the nozzle 249d so as to correspond to the central region of the wafer arrangement region in the wafer arrangement direction, i.e., the second zone. The nozzle 249d, i.e., Rc, is configured to supply a gas to the second zone and not to perform the supply of a gas to other zones, i.e., the first and third zones.

The gas discharge holes 250e of the nozzle 249e are installed only at the lower portion of the nozzle 249e so as to correspond to the lower region of the wafer arrangement region in the wafer arrangement direction, i.e., the third zone. The nozzle 249e, i.e., Rb, is configured to supply a gas to the third zone and not to perform the supply of a gas to other zones, i.e., the first and second zones.

Each of the gas discharge holes 250a to 250e is opened so as to face the center of the process chamber 201, and is configured to supply a gas toward the center of the wafers 200. The gas discharge holes 250a to 250e have the same opening area, and are installed at the same opening pitch.

As shown in FIG. 2, gas supply pipes 232a to 232e are connected to the nozzles 249a to 249e, respectively. In the gas supply pipes 232a to 232e, MFCs (mass flow controllers) 241a to 241e, which are flow rate controllers (flow rate control parts), and valves 243a to 243e, which are opening/closing valves, are installed sequentially from the upstream side of a gas flow. A gas supply pipe 232g is connected to the gas supply pipe 232a at the downstream side of the valve 243a. In the gas supply pipe 232g, an MFC 241g and a valve 243g are installed sequentially from the upstream side of a gas flow. Gas supply pipes 232f and 232h are connected to the gas supply pipe 232b at the downstream side of the valve 243b. In the gas supply pipes 232f and 232h, MFCs 241f and 241h and valves 243f and 243h are respectively installed sequentially from the upstream side of a gas flow.

As a precursor (precursor gas), a halosilane-based gas containing silicon (Si) as a main element constituting a film to be formed and a halogen element is supplied from the gas supply pipe 232a into the process chamber 201 via the MFC 241a, the valve 243a, and the nozzle 249a.

The precursor gas refers to a gas in a gaseous state, for example, a gas obtained by vaporizing a precursor staying in a liquid state under a room temperature and an atmospheric pressure, a precursor staying in a gaseous state under a room temperature and an atmospheric pressure, or the like. The halosilane-based gas refers to a silane-based gas having halogen groups. The halogen groups include halogen elements such as chlorine (Cl), fluorine (F), bromine (Br), iodine (I), and the like. As the halosilane-based gas, for example, a precursor gas containing Si and Cl, namely a chlorosilane-based gas may be used. The chlorosilane-based gas acts as a Si source. As the chlorosilane-based gas, for example, a hexachlorodisilane ($Si_2Cl_6$, abbreviation: HCDS) gas may be used.

As a reactant (reaction gas), an oxygen (O)-containing gas acting as an oxidant (oxidizing gas) is supplied from the gas supply pipe 232b into the process chamber 201 via the MFC 241b, the valve 243b, and the nozzle 249b. The O-containing gas acts as an O source. As the O-containing gas, for example, an oxygen ($O_2$) gas may be used.

As a reactant (reaction gas), a nitrogen (N)-containing gas acting as a nitriding agent (nitriding gas) is supplied from the gas supply pipe 232f into the process chamber 201 via the MFC 241f, the valve 243f, the gas supply pipe 232b, and the nozzle 249b. The N-containing gas acts as a N source. As the N-containing gas, for example, an ammonia ($NH_3$) gas, which is a hydrogen nitride-based gas, may be used.

An inert gas is supplied from the gas supply pipes 232c to 232e into the process chamber 201 via the MFCs 241c to 241e, the valves 243c to 243e, and the nozzles 249c to 249e, respectively. In addition, an inert gas is supplied from the gas supply pipes 232g and 232h into the process chamber 201 via the MFCs 241g and 241h, the valves 243g and 243h, the gas supply pipes 232a and 232b, and the nozzles 249a and 249b, respectively. The inert gas supplied from the nozzles 249c to 249e into the process chamber 201 mainly acts as a dilution gas described below. The inert gas supplied from the nozzles 249a and 249b into the process chamber 201 mainly acts as a purge gas and a carrier gas. As the inert gas, for example, the nitrogen ($N_2$) gas may be used.

A precursor supply system mainly includes the gas supply pipe 232a, the MFC 241a, and the valve 243a. An oxidant supply system mainly includes the gas supply pipe 232b, the MFC 241b, and the valve 243b. A nitriding agent supply system mainly includes the gas supply pipe 232f, the MFC 241f, and the valve 243f. An inert gas supply system mainly includes the gas supply pipes 232c to 232e, 232g, and 232h, the MFCs 241c to 241e, 241g, and 241h, and the valves 243c to 243e, 243g, and 243h.

The nozzle 249a for supplying the precursor is also referred to as a precursor supply part or a precursor gas nozzle. In the case where the oxidant is supplied from the nozzle 249b, the nozzle 249b is also referred to as an oxidant supply part or an oxidizing gas nozzle. In the case where the nitriding agent is supplied from the nozzle 249b, the nozzle 249b is also referred to as a nitriding agent supply part or a nitriding gas nozzle. The nozzles 249a and 249b are collectively referred to as a processing gas supply part or a processing gas nozzle. The nozzles 249c to 249e for supplying the inert gas are collectively referred to as an inert gas supply part or an inert gas nozzle. Furthermore, each of the inert gas supply part and the inert gas nozzle may be referred to as a dilution gas supply part and a dilution gas nozzle, respectively, as described below. The nozzles 249c to 249e are also referred to as first to third supply parts or first to third nozzles, respectively. The inert gas supply part is a supply part different from the precursor supply part, the oxidant supply part, or the nitriding agent supply part, and includes a plurality of supply parts called first to third supply parts. In the case where the inert gas is supplied from the nozzles 249a and 249b, the nozzles 249a and 249b may be included in the inert gas supply part.

The precursor supply system is configured to supply a flow-rate-controlled precursor from the nozzle 249a to a plurality of zones, i.e., all of the first to third zones. The oxidant supply system is configured to supply a flow-rate-controlled oxidant from the nozzle 249b to a plurality of zones, i.e., all of the first to third zones. The nitriding agent supply system is configured to supply a flow-rate-controlled nitriding agent from the nozzle 249b to a plurality of zones, i.e., all of the first to third zones. The inert gas supply system is configured to supply an individually-flow-rate-controlled inert gas from each of the nozzles 249c to 249e to a plurality of zones, i.e., each of the first to third zones.

The inert gas supply part is configured to supply an individually-flow-rate-controlled inert gas from the nozzle 249c to the first zone, not to perform supply of an inert gas to other zones (the second and third zones), to supply an individually-flow-rate-controlled inert gas from the nozzle 249d to the second zone, not to perform supply of an inert gas to other zones (the first and third zones), to supply an individually-flow-rate-controlled inert gas from the nozzle 249e to the third zone, and not to perform supply of an inert gas to other zones (the first and second zones).

At the side surface of the inner tube 204, an exhaust port (exhaust slit) 204c configured as, for example, a slit-shaped through-hole is formed in a vertically elongated shape. The exhaust port 204c is, for example, rectangular in a front view, and is formed from the lower portion to the upper portion of the side wall of the inner tube 204. The inside of the process chamber 201 and an exhaust space 205, which is an annular space between the inner tube 204 and the outer tube 203, communicate with each other through the exhaust port 204c. The exhaust port 204c is arranged on an extension line of the aforementioned straight line L1 in a plan view. That is, the nozzle accommodation chamber 204a and the exhaust port 204c are opposed to each other across the centers of the wafers 200 accommodated in the process chamber 201. In addition, the gas discharge holes 250a of the nozzle 249a and the exhaust port 204c are opposed to each other across the centers of the wafers 200 accommodated in the process chamber 201.

As shown in FIG. 1, an exhaust pipe 231 for exhausting the atmosphere in the process chamber 201 via the exhaust space 205 is connected to the lower portion of the outer tube 203. A vacuum pump 246 as a vacuum evacuation device is connected to the exhaust pipe 231 via a pressure sensor 245 as a pressure detector (pressure detection part) for detecting the pressure inside the exhaust space 205, i.e., the process chamber 201 and an APC (Auto Pressure Controller) valve 244 as a pressure regulator (pressure regulation part). The APC valve 244 is configured so that the vacuum evacuation of the interior of the process chamber 201 and the stop of the vacuum evacuation thereof can be performed by opening and closing the APC valve 244 in a state in which the vacuum pump 246 is operated, and so that the pressure inside the process chamber 201 can be regulated by adjusting the valve opening degree based on the pressure information detected by the pressure sensor 245 in a state in which the vacuum pump 246 is operated. An exhaust system mainly includes the exhaust pipe 231, the APC valve 244, and the pressure sensor 245. The exhaust port 204c, the exhaust space 205, and the vacuum pump 246 may be included in the exhaust system.

The lower end opening of the manifold 209 is hermetically sealed by a seal cap 219 via an O-ring 220b. Below the seal cap 219, there is installed a rotation mechanism 267 for rotating a boat 217 to be described below. A rotating shaft 255 of the rotation mechanism 267 passes through the seal cap 219 and is connected to the boat 217. The rotation mechanism 267 is configured to rotate the wafers 200 by rotating the boat 217. The seal cap 219 is configured to be raised and lowered in the vertical direction by a boat elevator 115 as an elevating mechanism vertically installed outside the reaction tube 210. The boat elevator 115 is configured as a transfer device (transfer mechanism) that loads and unloads (transfers) the wafers 200 supported by the boat 217 into and out of the process chamber 201 by raising and lowering the seal cap 219.

The boat 217 serving as a substrate support is configured to support a plurality of wafers 200, for example, 25 to 200 wafers, in such a state that the wafers 200 are arranged in a horizontal posture and in multiple stages along a vertical direction with the centers of the wafers 200 aligned with one another. As such, the boat 217 is configured to arrange the wafers 200 to be spaced apart from each other. The boat 217 is made of a heat resistant material such as, for example, quartz or SiC. Heat-insulating plates 218 made of a heat resistant material such as, for example, quartz or SiC are disposed in multiple stages at the lower portion of the boat 217.

Between the outer tube 203 and the inner tube 204, there is installed a temperature sensor 263 as a temperature detector. By adjusting a state of supplying electric power to the heater 207 based on the temperature information detected by the temperature sensor 263, the temperature inside the process chamber 201 is controlled to have a desired temperature distribution. The temperature sensor 263 is installed along the inner wall of the outer tube 203.

Figure 3:
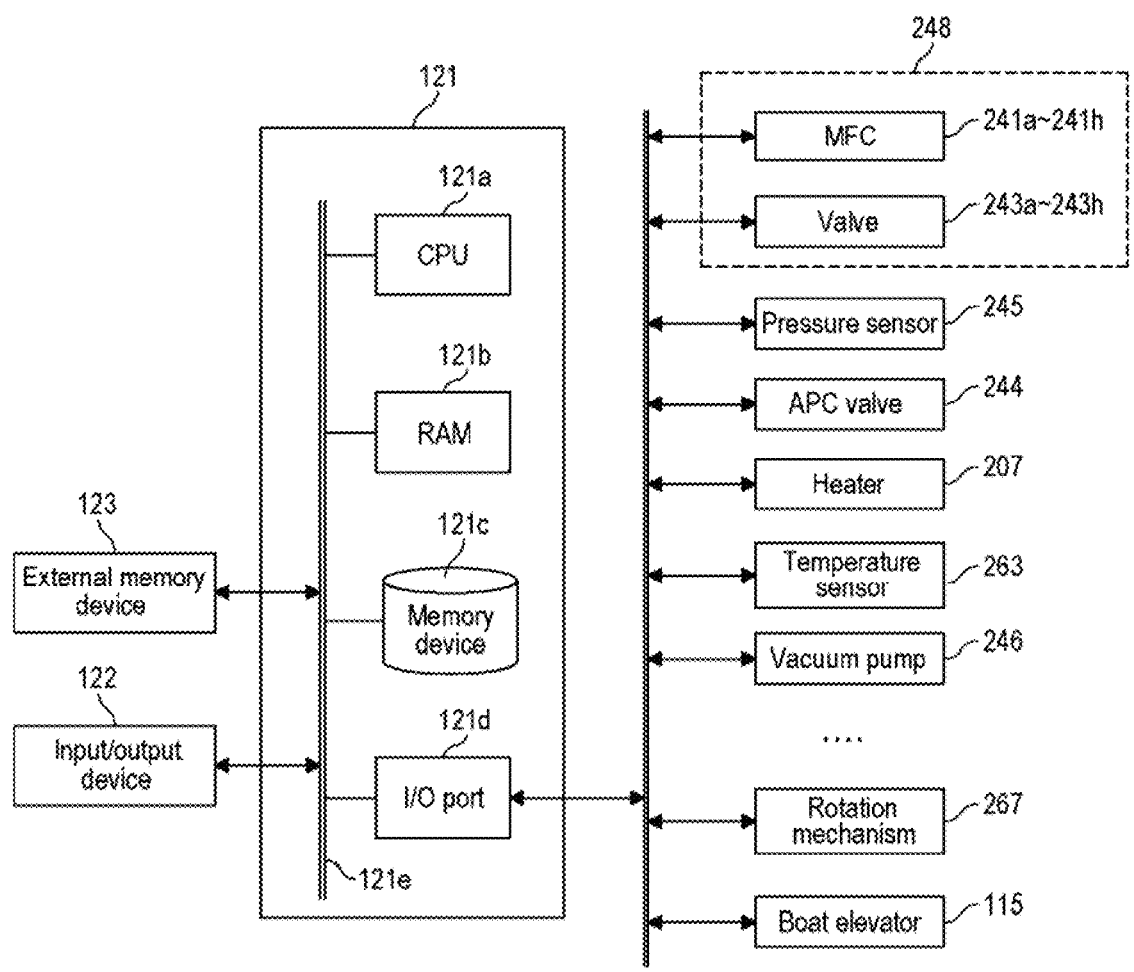
FIG. 3 is a schematic configuration diagram of a controller of the substrate processing apparatus suitably used in embodiments of the present disclosure, in which a diagram of a control system of the controller is shown in a block diagram.

As shown in FIG. 3, the controller 121 as a control part (control means) is configured as a computer including a CPU (Central Processing Unit) 121a, a RAM (Random Access Memory) 121b, a memory device 121c, and an I/O port 121d. The RAM 121b, the memory device 121c, and the I/O port 121d are configured to exchange data with the CPU 121a via an internal bus 121e. An input/output device 122 formed of, for example, a touch panel or the like is connected to the controller 121.

The memory device 121c is configured by, for example, a flash memory, a HDD (Hard Disc Drive), or the like. A control program for controlling the operations of the substrate processing apparatus, a process recipe in which sequences and conditions of a substrate-processing process to be described below are written, and the like are readably stored in the memory device 121c. The process recipe is a combination for causing the controller 121 to execute each sequence in a below-described substrate-processing process to obtain a predetermined result, and functions as a program. Hereinafter, the process recipe and the control program will be generally and simply referred to as a "program." Furthermore, the process recipe will also be simply referred to as a "recipe." When the term "program" is used herein, it may indicate a case of including only the recipe, a case of including only the control program, or a case of including both the recipe and the control program. The RAM 121b is configured as a memory area (work area) in which a program or data read by the CPU 121a is temporarily stored.

The I/O port 121d is connected to the MFCs 241a to 241h, the valves 243a to 243h, the pressure sensor 245, the APC valve 244, the vacuum pump 246, the heater 207, the temperature sensor 263, the rotation mechanism 267, the boat elevator 115, and the like.

The CPU 121a is configured to read the control program from the memory device 121c and execute the same. The CPU 121a is also configured to read the recipe from the memory device 121c according to an input of an operation command from the input/output device 122. The CPU 121a is configured to control, according to the contents of the recipe thus read, the flow-rate-adjusting operation of various kinds of gases by the MFCs 241a to 241h, the opening/closing operation of the valves 243a to 243h, the opening/closing operation of the APC valve 244, the pressure-regulating operation performed by the APC valve 244 based on the pressure sensor 245, the driving and stopping of the vacuum pump 246, the temperature-adjusting operation performed by the heater 207 based on the temperature sensor 263, the rotating and rotating-speed-adjusting operation of rotating the boat 217 with the rotation mechanism 267, the operation of moving the boat 217 up and down with the boat elevator 115, and the like.

The controller 121 may be configured by installing, in a computer, the aforementioned program stored in an external memory device 123. The external memory device 123 includes, for example, a magnetic disk such as a HDD or the like, an optical disk such as a CD or the like, a magneto-optical disk such as a MO or the like, and a semiconductor memory such as a USB memory or the like. The memory device 121c or the external memory device 123 is configured as a non-transitory computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. The provision of the program to the computer may be performed by using a communication means such as the Internet or a dedicated line without using the external memory device 123.

(2) Substrate-Processing Process

A substrate-processing sequence example, i.e., a film-forming sequence example, of forming an oxynitride film on a wafer 200 as a substrate using the aforementioned substrate processing apparatus, which is a process for manufacturing a semiconductor device, will be described with reference to FIG. 4. In the following description, the operations of the respective parts that constitute the substrate processing apparatus are controlled by the controller 121.

Figure 4:
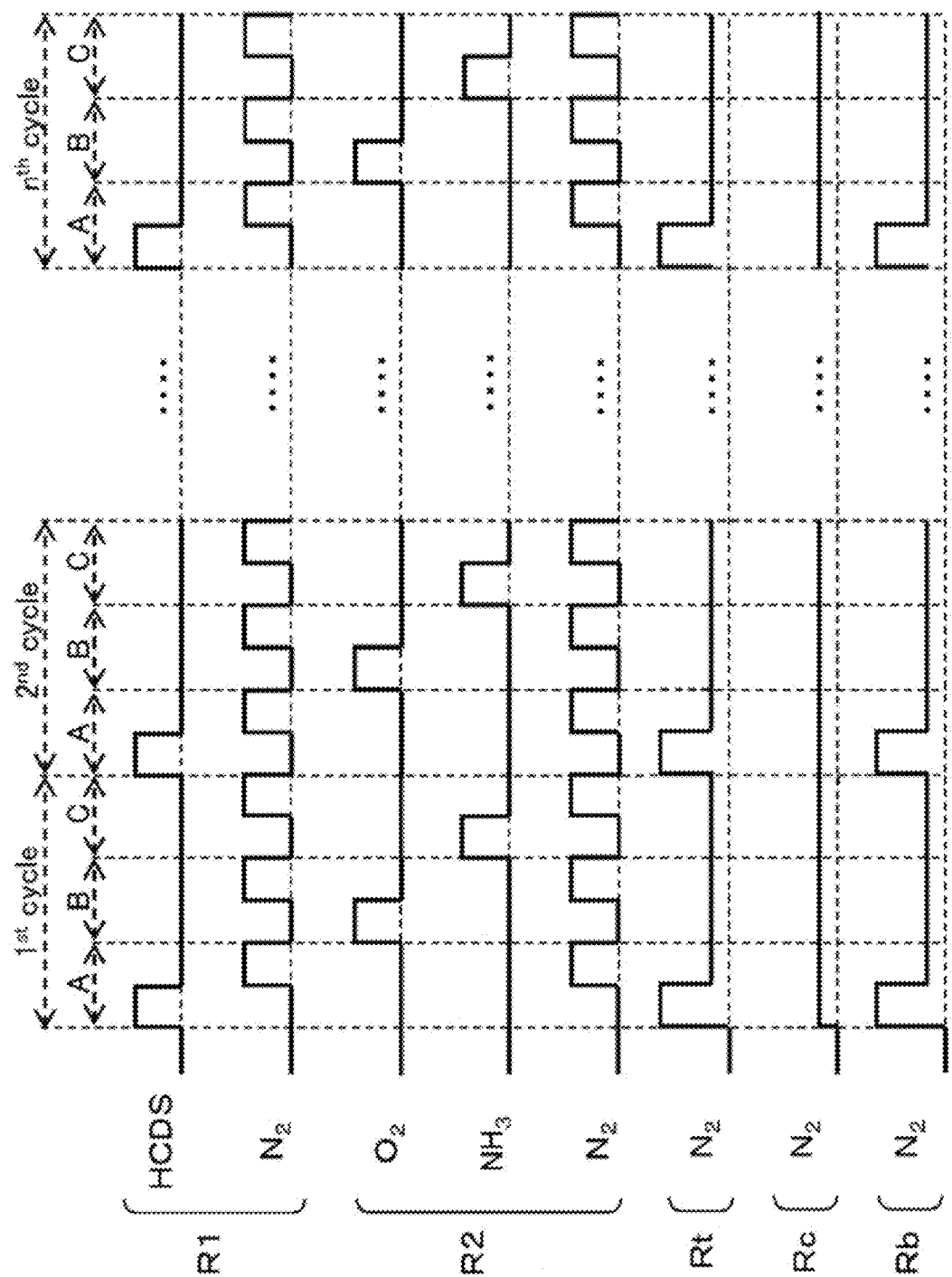
FIG. 4 is a diagram showing an example of a film-forming sequence according to embodiments of the present disclosure.

In the film-forming sequence shown in FIG. 4, a film containing Si, O, and N, i.e., a silicon oxynitride film (SiON film) is formed as an oxynitride film on each of the wafers 200 by performing a cycle a predetermined number of times (n times where n is an integer of 1 or more), the cycle including non-simultaneously performing:

step A of supplying a HCDS gas as a precursor to the wafers 200 from the nozzle 249a serving as a precursor supply part;

step B of supplying an $O_2$ gas as an oxidant to the wafers 200 from the nozzle 249b serving as an oxidant supply part; and step C of supplying an $NH_3$ gas as a nitriding agent to the wafers 200 from the nozzle 249b serving as a nitriding agent supply part.

In step A of the film-forming sequence shown in FIG. 4, the concentration distribution of the HCDS gas as a precursor in the arrangement direction of the wafers 200 is adjusted by supplying a $N_2$ gas as an inert gas to the wafers 200 from an inert gas supply part different from the precursor supply part, i.e., the nozzles 249c to 249e different from the nozzle 249a, and controlling the flow rate of the $N_2$ gas. The $N_2$ gas as an inert gas supplied from the nozzles 249c to 249e functions as a dilution gas for the HCDS gas as a precursor.

In this specification, for the sake of convenience, the film-forming sequence shown in FIG. 4 may be denoted as follows. In FIG. 4, the execution periods of steps A to C are represented by A to C for the sake of convenience. These points are the same in modifications and other embodiments described below.

(R1: HCDS, Rt to Rb: $N_2 \rightarrow$R2: $O_2 \rightarrow$R2: $NH_3$)×
n⇒SiON

When the term "wafer" is used herein, it may refer to "a wafer itself" or "a laminated body of a wafer and a predetermined layer or film formed on the surface of the wafer." Furthermore, when the phrase "a surface of a wafer" is used herein, it may refer to "a surface of a wafer itself" or "a surface of a predetermined layer or the like formed on a wafer." Moreover, the expression "a predetermined layer is formed on a wafer" as used herein may mean that "a predetermined layer is directly formed on a surface of a wafer itself" or that "a predetermined layer is formed on a layer or the like formed on a wafer." In addition, when the term "substrate" is used herein, it may be synonymous with the term "wafer."

(Wafer Charging and Boat Loading)

A plurality of wafers 200 is charged to the boat 217 (wafer charging). Thereafter, as shown in FIG. 1, the boat 217 supporting the plurality of wafers 200 is lifted up by the boat elevator 115 and is loaded into the process chamber 201 (boat loading). In this state, the seal cap 219 seals the lower end of the manifold 209 via the O-ring 220b.

Figure 5:
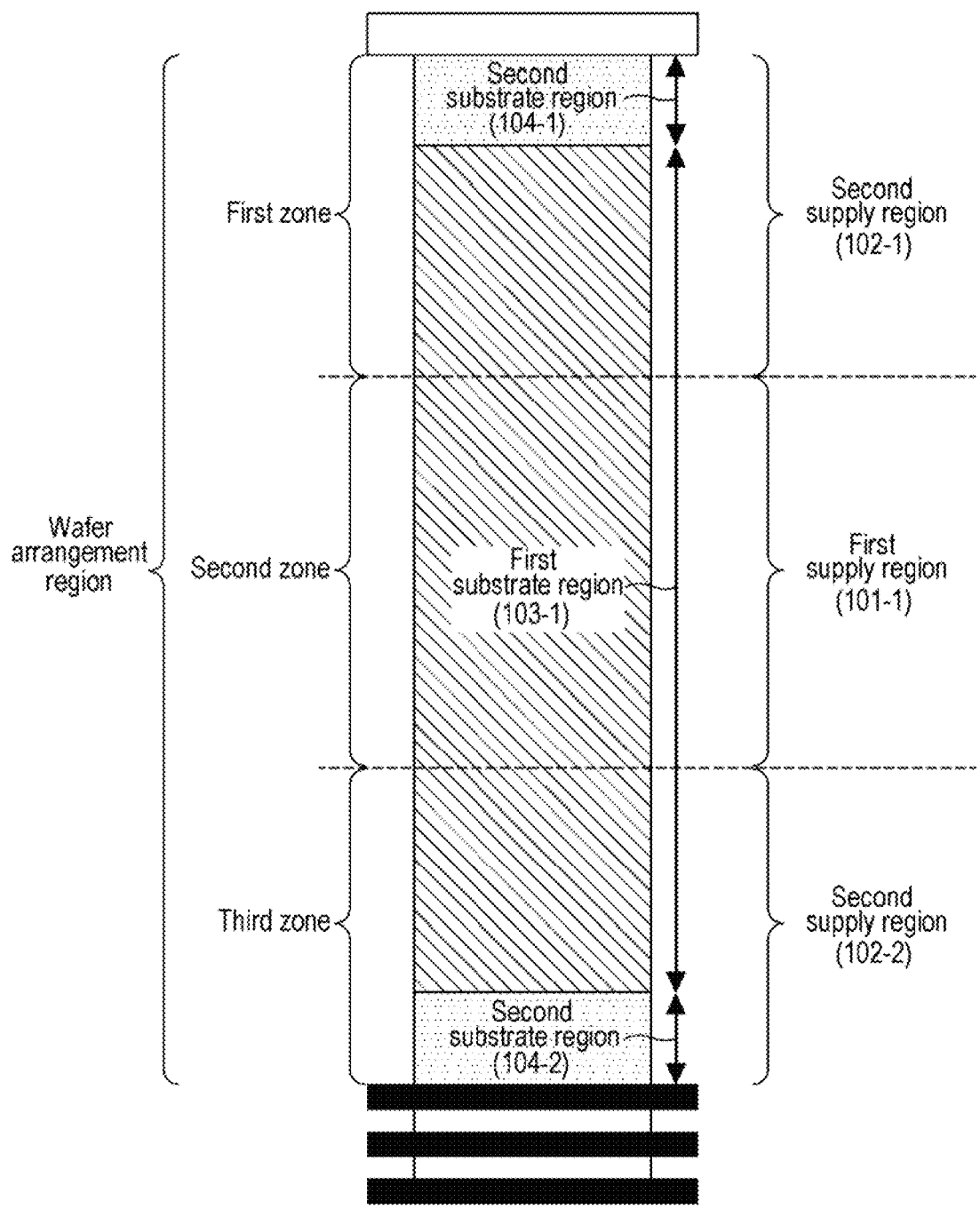
FIG. 5 is a diagram showing an arrangement state of wafers in embodiments of the present disclosure.

In the present embodiments, as shown in FIG. 5, a large surface area wafer 200a as a first substrate and a small surface area wafer 200b as a second substrate are charged as the plurality of wafers 200 to the wafer arrangement region of the boat 217. The large surface area wafer 200a is a wafer having a larger surface area than the small surface area wafer 200b. For example, the large surface area wafer 200a is a device wafer (product wafer) having a surface on which a pattern constituting a semiconductor device or the like is formed. The small surface area wafer 200b is a wafer having a smaller surface area than the large surface area wafer 200a. For example, the small surface area wafer 200b is a dummy wafer or test wafer having a surface on which no pattern or the like is formed (i.e., having a plain structure).

The boat 217 includes slots capable of charging 120 wafers 200 over the entire wafer arrangement region. In the present embodiments, ten small surface area wafers 200b are charged to the upper side of the first zone, and ten small surface area wafers 200b are charged to the lower side of the third zone. In addition, 100 large surface area wafers 200a are charged from the first zone to the third zone. The region in the wafer arrangement region where the large surface area wafers 200a are charged is referred to as a first substrate region, and the region in the wafer arrangement region where the small surface area wafers 200b are charged is referred to as a second substrate region.

(Pressure Regulation and Temperature Adjustment)

Subsequently, the interior of the process chamber 201, namely the space in which the wafers 200 exist, is vacuum-evacuated (depressurization-evacuated) by the vacuum pump 246 so as to reach a desired pressure (degree of vacuum). At this time, the pressure in the process chamber 201 is measured by the pressure sensor 245. The APC valve 244 is feedback-controlled based on the measured pressure information. The wafers 200 in the process chamber 201 are heated by the heater 207 to a desired temperature. At this time, the state of supplying electric power to the heater 207 is feedback-controlled based on the temperature information detected by the temperature sensor 263 such that the interior of the process chamber 201 has a desired temperature distribution. In addition, the rotation of the wafers 200 by the rotation mechanism 267 begins. The evacuation in the process chamber 201 and the heating and rotation of the wafers 200 may be continuously performed at least until the process to the wafers 200 is completed.

(Film-Forming Step)

Then, the following steps A to C are sequentially performed in a state in which a plurality of wafers 200 is arranged in the wafer arrangement region.

[Step A]

In this step, the HCDS gas is supplied to the wafers 200 in the process chamber 201 (HCDS gas supply step).

Specifically, the valve 243a is opened, and a HCDS gas is allowed to flow into the gas supply pipe 232a. The flow rate of the HCDS gas is adjusted by the MFC 241a. The HCDS gas is supplied into the process chamber 201 from the respective gas discharge holes 250a formed at the side surface of the nozzle 249a, and is exhausted from the exhaust pipe 231 via the exhaust port 204c and the exhaust space 205. At this time, the HCDS gas is supplied to the wafers 200.

At this time, the valves 243c to 243e are opened, and a $N_2$ gas is supplied into the process chamber 201 from the nozzles 249c to 249e. In this case, by individually adjusting the flow rates of the $N_2$ gas supplied from the nozzles 249c to 249e, the film thickness of the SiON film formed on the large surface area wafer 200a is adjusted. The specific contents of the flow rate adjustment and the effects thereof will be described below.

In the HCDS gas supply step, the valves 243g and 243h may be opened to supply the $N_2$ gas into the process chamber 201 from the nozzles 249a and 249b. By supplying the N$_2$ gas from the nozzles 249b to 249e, it is possible to suppress the entry of the HCDS gas into the nozzles 249b to 249e.

An example of processing conditions in this step may be described as follows.

HCDS gas supply flow rate: 0.01 to 2 slm, preferably 0.1 to 1 slm
    N$_2$ gas supply flow rate (for each of Rt and Rb): 0.5 to 10 slm
    N$_2$ gas supply flow rate (for Rc): 0 to 0.1 slm
    N$_2$ gas supply flow rate (for R1): 0 to 10 slm
    N$_2$ gas supply flow rate (for R2): 0 to 0.1 slm
    Gas supply time for each gas: 1 to 120 seconds, preferably 1 to 60 seconds
    Processing temperature: 250 to 800 degrees C., preferably 400 to 700 degrees C.
    Processing pressure: 1 to 2,666 Pa, preferably 67 to 1,333 Pa The notation of the numerical range such as "250 to 800 degrees C." in the present disclosure means that the lower limit value and the upper limit value are included in the range. Thus, for example, "250 to 800 degrees C." means "250 degrees C. or higher and 800 degrees C. or lower." The same applies to other numerical ranges.

By supplying the HCDS gas to the wafer 200 under the conditions described above, a Si-containing layer containing Cl is formed as a first layer on the outermost surface of the wafer 200. The Si-containing layer containing Cl is formed as HCDS is physically adsorbed at the outermost surface of the wafer 200, as a substance (hereinafter referred to as Si$_x$Cl$_y$,) generated by partial decomposition of HCDS is chemically adsorbed at the outermost surface of the wafer 200, or as Si is deposited at the outermost surface of the wafer 200 by the pyrolysis of HCDS. The Si-containing layer containing Cl may be an adsorption layer (physical adsorption layer or chemical adsorption layer) of HCDS or Si$_x$Cl$_y$, or may be a Si layer (Si deposition layer) containing Cl. In the present disclosure, the Si-containing layer containing Cl is also simply referred to as a Si-containing layer.

After a first layer is formed, the valve 243a is closed to stop the supply of the HCDS gas into the process chamber 201. Then, the inside of the process chamber 201 is vacuum-evacuated to remove the gas and the like remaining in the process chamber 201 from the inside of the process chamber 201 (purging step). At this time, the valves 243c to 243e, 243g, and 243h are opened to supply the N$_2$ gas into the process chamber 201 from the nozzles 249a to 249e. The N$_2$ gas acts as a purge gas.

As the precursor (precursor gas), in addition to the HCDS gas, it may be possible to use a chlorosilane-based gas such as a monochlorosilane (SiH$_3$Cl, abbreviation: MCS) gas, a dichlorosilane (SiH$_2$Cl$_2$, abbreviation: DCS) gas, a trichlorosilane (SiHCl$_3$, abbreviation: TCS) gas, a tetrachlorosilane (SiCl$_4$, abbreviation: STC) gas, an octachlorotrisilane (Si$_3$Cl$_8$, abbreviation: OCTS) gas, or the like.

As the inert gas, in addition to the N$_2$ gas, it may be possible to use a rare gas such as an Ar gas, a He gas, a Ne gas, a Xe gas, or the like. This applies to the respective steps described below.

[Step B]

After step A is completed, an O$_2$ gas is supplied to the wafers 200 in the process chamber 201, i.e., the first layer formed on each of the wafers 200 (O$_2$ gas supply step).

Specifically, the valve 243b is opened, and the O$_2$ gas is allowed to flow into the gas supply pipe 232b. The flow rate of the O$_2$ gas is adjusted by the MFC 241b. The O$_2$ gas is supplied into the process chamber 201 from each of the plurality of gas discharge holes 250b installed at the side surface of the nozzle 249b, and is exhausted from the exhaust pipe 231 via the exhaust port 204c and the exhaust space 205. At this time, the O$_2$ gas is supplied to the wafers 200.

At this time, as in step A, the N$_2$ gas is supplied into the process chamber 201 from the nozzles 249c to 249e. In step B, the N$_2$ gas is supplied from the nozzles 249c to 249e into the process chamber 201 for the purpose of suppressing the entry of the O$_2$ gas into the nozzles 249c to 249e. As in step A, by individually adjusting the flow rates of the N$_2$ gas supplied from the nozzles 249c to 249e, it is possible to adjust the film thickness of the SiON film formed on the large surface area wafer 200a, or the like.

In the O$_2$ gas supply step, as in step A, the N$_2$ gas may be supplied from the nozzles 249a and 249b into the process chamber 201.

An example of processing conditions in this step may be described as follows.

O$_2$ gas supply flow rate: 0.1 to 10 slm
    N$_2$ gas supply flow rate (for each of Rt, Rc, and Rb): 0 to 0.1 slm
    N$_2$ gas supply flow rate (for R2): 0 to 10 slm
    N$_2$ gas supply flow rate (for R1): 0 to 0.1 slm
    Gas supply time for each gas: 1 to 120 seconds, preferably 1 to 60 seconds
    Processing pressure: 1 to 4,000 Pa, preferably 1 to 3,000 Pa
    Other processing conditions are the same as the processing conditions in step A.

By supplying the O$_2$ gas to the wafers 200 under the above conditions, at least a part of the first layer formed on each of the wafers 200 is oxidized (modified). By modifying the first layer, a layer containing Si and O, i.e., a SiO layer, is formed as a second layer on each of the wafers 200. When forming the second layer, impurities such as Cl and the like contained in the first layer constitute a gaseous substance containing at least Cl in the course of the reaction of modifying the first layer with the O$_2$ gas, and are exhausted from the inside of the process chamber 201. Thus, the second layer becomes a layer having a smaller amount of impurities such as Cl and the like than the first layer.

After the second layer is formed, the valve 243b is closed to stop the supply of the O$_2$ gas into the process chamber 201. Then, the gas and the like remaining in the process chamber 201 are removed from the process chamber 201 by the same processing procedure as the purging step of step A (purging step).

As the oxidant (oxidizing gas), in addition to the O$_2$ gas, it may be possible to use an O-containing gas such as a nitrous oxide (N$_2$O) gas, a nitric oxide (NO) gas, a nitrogen dioxide (NO$_2$) gas, an ozone (O$_3$) gas, a water vapor (H$_2$O gas), a carbon monoxide (CO) gas, a carbon dioxide (CO$_2$) gas, or the like.

[Step C]

After step B is completed, an NH$_3$ gas is supplied to the wafers 200 in the process chamber 201, i.e., the second layer formed on each of the wafers 200 (NH$_3$ gas supply step).

Specifically, the valve 243f is opened, and the NH$_3$ gas is allowed to flow into the gas supply pipe 232f. The flow rate of the NH$_3$ gas is adjusted by the MFC 241f. The NH$_3$ gas flows into the nozzle 249b via the gas supply pipe 232b. The NH$_3$ gas is supplied into the process chamber 201 from each of the plurality of gas discharge holes 250b installed at the side surface of the nozzle 249b, and is exhausted from the exhaust pipe 231 via the exhaust port 204c and the exhaust space 205. At this time, the NH₃ gas is supplied to the wafers 200.

At this time, as in steps A and B, the N₂ gas is supplied into the process chamber 201 from the nozzles 249c to 249e. In step C, as in step B, the N₂ gas is supplied from the nozzles 249c to 249e into the process chamber 201 for the purpose of suppressing the entry of the NH₃ gas into the nozzles 249c to 249e. As in step A, by individually adjusting the flow rates of the N₂ gas supplied from the nozzles 249c to 249e, it is possible to adjust the film thickness of the SiON film formed on the large surface area wafer 200a, or the like.

In the NH₃ gas supply step, as in step A, the N₂ gas may be supplied from the nozzles 249a and 249b into the process chamber 201.

An example of processing conditions in this step may be described as follows.

NH₃ gas supply flow rate: 0.1 to 10 slm
N₂ gas supply flow rate (for each of Rt, Rc, and Rb): 0 to 0.1 slm
N₂ gas supply flow rate (for R2): 0 to 10 slm
N₂ gas supply flow rate (for R1): 0 to 0.1 slm
Gas supply time for each gas: 1 to 120 seconds, preferably 1 to 60 seconds
Processing pressure: 1 to 4,000 Pa, preferably 1 to 3,000 Pa
Other processing conditions are the same as the processing conditions in step A.

By supplying the NH₃ gas to the wafers 200 under the above-described conditions, at least a part of the second layer formed on each of the wafers 200 is nitrided (modified). By modifying the second layer, a layer containing Si, O, and N, namely a SiON layer, is formed as a third layer on each of the wafers 200. When forming the third layer, impurities such as Cl and the like contained in the second layer constitute a gaseous substance containing at least Cl in the course of the reaction of modifying the second layer with the NH₃ gas, and are discharged from the inside of the process chamber 201. Thus, the third layer becomes a layer having a smaller amount of impurities such as Cl and the like than the second layer.

After the third layer is formed, the valve 243f is closed to stop the supply of the NH₃ gas into the process chamber 201. Then, by the same processing procedure as in the purging step of step A, the gas and the like remaining in the process chamber 201 are removed from the inside of the process chamber 201 (purging step).

As the nitriding agent (nitriding gas), in addition to the NH₃ gas, it may be possible to use a N-containing gas such as a diazene (N₂H₂) gas, a hydrazine (N₂H₄) gas, a N₃H₈ gas, or the like.

[Performing a Predetermined Number of Times]

A SiON film having a desired film thickness and a desired composition can be formed on each of the wafers 200 by performing a cycle once or more (n times), the cycle including non-simultaneously, i.e., asynchronously performing steps A to C. The cycle described above is preferably repeated a plurality of times. That is to say, it is preferable that the thickness of the third layer formed when performing the above-described cycle once is set to be smaller than a desired film thickness, and the above-described cycle is repeated a plurality of times until the film thickness of the SiON film formed by stacking the third layer reaches the desired film thickness.

(After-Purging and Atmospheric Pressure Restoration)

After the film-forming step is completed, the N₂ gas is supplied from each of the nozzles 249a to 249e into the process chamber 201, and is exhausted from the exhaust pipe 231 via the exhaust port 204c and the exhaust space 205. The N₂ gas acts as a purge gas. Thus, the inside of the process chamber 201 is purged, and the gas or the reaction byproducts remaining in the process chamber 201 is removed from the interior of the process chamber 201 (after-purging). Thereafter, the atmosphere in the process chamber 201 is replaced by an inert gas (inert gas replacement), and the pressure in the process chamber 201 is restored to the atmospheric pressure (atmospheric pressure restoration).

(Boat Unloading and Wafer Discharging)

The seal cap 219 is lowered by the boat elevator 115 and the lower end of the manifold 209 is opened. Then, the processed wafers 200 are unloaded from the lower end of the manifold 209 to the outside of the reaction tube 210 in a state in which the processed wafers 200 are supported by the boat 217 (boat unloading). The processed wafers 200 are unloaded to the outside of the reaction tube 210, and then are discharged from the boat 217 (wafer discharging).

(3) Flow Control of N₂ Gas and Effects

Hereinafter, the specific contents of the flow rate control of the N₂ gas performed in step A and the effects thereof will be described.

The HCDS gas supplied to the surfaces of the wafers 200 in step A is consumed by adsorption, decomposition, or the like that occurs when forming the Si-containing layer on the surface of each of the wafers 200. At this time, the larger the surface area of each of the wafers 200 to which the HCDS gas is supplied, the larger the amount of the gas consumed per time. That is, the HCDS gas supplied to the large surface area wafer 200a is consumed faster than the HCDS gas supplied to the surface of the small surface area wafer 200b.

For this reason, as in the present embodiments, if the HCDS gas having the same concentration and flow rate (particularly, the flow rate supplied to each of the wafers 200 in this case) is supplied to the first substrate region in which the large surface area wafer 200a is arranged and the second substrate region in which the small surface area wafer 200b is arranged, by using the nozzle 249a having the gas discharge holes 250a formed evenly over the entire wafer arrangement region, the concentration of the HCDS gas in the second substrate region becomes higher than the concentration of the HCDS gas in the first substrate region just as much as the reduced consumption rate. Furthermore, the high-concentration HCDS gas in the second substrate region goes around to a region in the first substrate region adjacent to the second substrate region (hereinafter also referred to as an adjacent substrate region), thereby increasing the concentration of the HCDS gas in the adjacent substrate region. As a result, the thickness of the Si-containing layer formed at the large surface area wafer 200a arranged in the adjacent substrate region is larger than the thickness of the Si-containing layer formed at the large surface area wafer 200a arranged outside the adjacent substrate region. That is, the thickness of the Si-containing layer formed on the surface of each of the large surface area wafers 200a arranged in the first substrate region varies between the large surface area wafers 200a.

Therefore, in the present embodiments, in step A, the N₂ gas as a dilution gas is supplied to the continuous first supply region which constitutes the substrate arrangement region, which includes a region (first substrate region) where at least a part of the plurality of large surface area wafers 200a is arranged and which does not include a region where the small surface area wafers 200b are arranged, or the supply of the N₂ gas as a dilution gas is not performed, and the N₂ gas as a dilution gas is supplied to the continuous second supply region which constitutes the substrate arrangement region, which is a region other than the first supply region and which includes a region (second substrate region) where the small surface area wafers 200b are arranged, at the flow rate (more specifically, the flow rate supplied per unit length in the arrangement direction of the wafers 200) larger than the flow rate of the $N_2$ gas as a dilution gas supplied to the first supply region (more specifically, the flow rate supplied per unit length in the arrangement direction of the wafers 200).

In the example shown in FIG. 5, the first zone and the third zone in which the small surface area wafers 200b are arranged are denoted as the second supply region, and the second zone in which only the large surface area wafers 200a are arranged is denoted as the first supply region. In step A, the flow rates of the $N_2$ gas supplied from each of Rt, Rb, and Rc are individually controlled so that the flow rate (second supply region flow rate) per unit length in the arrangement direction of the wafers 200 of the $N_2$ gas supplied from the nozzle 249c (Rt) as a first dilution gas nozzle and the nozzle 249e (Rb) as a third dilution gas nozzle becomes larger than the flow rate (first supply region flow rate) per unit length in the arrangement direction of the wafers 200 of the $N_2$ gas supplied from the nozzle 249d (Rc) as a second dilution gas nozzle.

For example, in the example shown in FIG. 5, the lengths of the first to third zones in the arrangement direction of the wafers 200 are substantially the same. In this case, the MFCs 241c to 241e are respectively controlled so that the flow rate of the $N_2$ gas supplied from each of Rt and Rb into the process chamber 201 (the total flow rate of the $N_2$ gas for each nozzle) becomes larger than the flow rate of the $N_2$ gas supplied from the Rc into the process chamber 201. Thus, the flow rate per unit length in the arrangement direction of the wafers 200 of the $N_2$ gas supplied from Rt and Rb can be made larger than the flow rate per unit length in the arrangement direction of the wafers 200 of the $N_2$ gas supplied from Rc.

As in the example shown in FIG. 5, if the gas discharge holes 250c, 250e, and 250d of Rt, Rb, and Rc are installed at substantially the same opening pitch in the arrangement direction of the wafers 200, the MFCs 241c to 241e are respectively controlled so that the flow rate of the $N_2$ gas supplied into the process chamber 201 at each opening of the gas discharge holes 250c and 250e (the flow rate of the $N_2$ gas per opening) becomes larger than the flow rate of the $N_2$ gas supplied into the process chamber 201 at each opening of the gas discharge holes 250d. Thus, the flow rate per unit length in the arrangement direction of the wafers 200 of the $N_2$ gas supplied from Rt and Rb can be made larger than the flow rate per unit length in the arrangement direction of the wafers 200 of the $N_2$ gas supplied from Rc.

Furthermore, if the wafers 200 are arranged at equal intervals over the entire wafer arrangement region as in the present embodiments, the MFCs 241c to 241e may be individually controlled so that the flow rate of the $N_2$ gas supplied from Rt and Rb to each of the wafers 200 (the flow rate of the $N_2$ gas supplied per wafer) becomes larger than the flow rate of the $N_2$ gas supplied from Rc to each of wafers 200 (the flow rate of the $N_2$ gas supplied per wafer).

The $N_2$ gas supplied to the second substrate region where the small surface area wafers are arranged, of the $N_2$ gas supplied into the second supply region, has the effect of reducing the amount of HCDS gas that is not consumed in the second substrate region and flows to the adjacent substrate region, by lowering a concentration of the HCDS gas supplied to the second substrate region. Further, the $N_2$ gas supplied to the adjacent substrate region, of the $N_2$ gas supplied into the second supply region, has the effect of suppressing an increase in the concentration of the HCDS gas in the adjacent substrate region due to the HCDS gas flowing from the second substrate region.

By controlling the supply flow rate of the $N_2$ gas as a dilution gas in accordance with the arrangement positions of the small surface area wafers 200b as described above, it is possible to suppress an increase in the concentration of the HCDS gas in the adjacent substrate region of the second supply region. In other words, it is possible to reduce the influence of the HCDS gas going around from the second substrate region into the adjacent substrate region.

It is preferred that the flow rates of the $N_2$ gas supplied from Rt to Rb are individually controlled so that the thickness of the Si-containing layer formed at the large surface area wafer 200a arranged in the first supply region and the thickness of the Si-containing layer formed at the large surface area wafer 200a arranged in the second supply region become closer to each other, and more preferably, become substantially equal to each other.

More specifically, the flow rates of the $N_2$ gas supplied from Rt to Rb are respectively controlled so that the concentration (partial pressure) of the HCDS gas in the second supply region (first and third zones) becomes closer to, and more preferably, becomes substantially equal to the concentration (partial pressure) of the HCDS gas in the first supply region (second zone). As an example of the flow rate of the $N_2$ gas supplied from Rt to Rb in step A (the total flow rate of the $N_2$ gas for each nozzle), the flow rate for Rt is 1.0 slm, the flow rate for Rc is 0 slm, and the flow rate for Rb is 1.0 slm. In this example, the flow rates of the $N_2$ gas supplied to the two second supply regions (the first zone and the third zone) are made equal to each other. However, the flow rates of the $N_2$ gas supplied to the different second supply regions may be controlled to become different.

Accordingly, the thickness of the Si-containing layer formed at the large surface area wafer 200a arranged in the first supply region and the thickness of the Si-containing layer formed at the large surface area wafer 200a arranged in the second supply region can be caused to become closer to each other, and more preferably, become substantially equal to each other. Similarly, for the SiON film formed in the above-described substrate-processing step, the thickness of the SiON film formed at the large surface area wafer 200a arranged in the first supply region and the thickness of the SiON film formed at the large surface area wafer 200a arranged in the second supply region can be caused to become closer to each other, and more preferably, become substantially equal to each other.

In the present embodiments, the supply flow rate (first supply region flow rate) of the $N_2$ gas as a dilution gas supplied from Rc is set to 0 slm. That is, in this case, in step A, the supply of the $N_2$ gas as a dilution gas to the first supply region is not performed, while the supply of the $N_2$ gas as a dilution gas is locally performed only to the second supply region. However, for the purpose of preventing the entry of the HCDS gas into Rc or finely adjusting the concentration distribution of the HCDS gas in the first supply region (second zone), a small amount of $N_2$ gas may also be supplied from Rc. For example, the supply flow rate (first supply region flow rate) of the $N_2$ gas from Rc may be set to 0.1 slm.

Furthermore, in the present embodiments, only in step A, the flow rate of the $N_2$ gas as a dilution gas supplied to the first to third zones is controlled in accordance with the position where the small surface area wafers 200b are arranged. Even in at least one selected from the group of steps B and C, the flow rate of the $N_2$ gas supplied to the first to third zones may be similarly adjusted so that the concentrations of the $O_2$ gas or the $NH_3$ gas supplied to the respective large surface area wafers 200a are made uniform.

The above-described effects may be similarly obtained even when the above-mentioned precursor other than the HCDS gas is used, when the above-mentioned oxidant other than the $O_2$ gas is used, when the above-mentioned nitriding agent other than the $NH_3$ gas is used, or when the above-mentioned inert gas other than the $N_2$ gas is used.

Modification 1 of the First Embodiments

In the first embodiments, as described above, when the supply of the $N_2$ gas from Rc is not performed, the substrate processing apparatus may be configured not to include Rc. In this case, the supply of the $N_2$ gas as a dilution gas is locally performed only in the second supply region (the first zone and the third zone) using Rt and Rb. This modification is suitable for a case where the small surface area wafers 200b are charged only at the upper end side and the lower end side of the wafer arrangement region area as in the first embodiments.

Modification 2 of the First Embodiments

Furthermore, in the first embodiments, there has been shown the example in which the flow rates of the $N_2$ gas supplied from Rt to Rb are respectively controlled to adjust the concentrations of the HCDS gas in the first supply region and the second supply region. However, the concentrations of the HCDS gas in the first supply region and the second supply region may be further adjusted by using, as a dilution gas, the $N_2$ gas supplied from at least one selected from the group of R1 and R2 in addition to Rt to Rb (or Rt and Rb). This modification is suitable in the case where it is difficult to adjust the concentration distribution of the HCDS gas in the wafer arrangement region to a desired distribution by adjusting only the flow rates of the $N_2$ gas supplied from Rt to Rb (or Rt and Rb).

Second Embodiments

In the first embodiments described above, there has been shown the example in which the wafers 200 (the large surface area wafers 200a and the small surface area wafers 200b) are charged to the boat 217 and processed as shown in FIG. 5. Now, an example in which the wafers 200 are charged and processed in the arrangement shown in FIG. 6, which is different from the first embodiments, will be described as second embodiments.

In the present embodiments, ten small surface area wafers 200b are charged at the central portion of the second zone, and ten small surface area wafers 200b are charged at the lower portion of the third zone. Furthermore, a total of 100 large surface area wafers 200a are charged at the entire first zone and at the region of the second and third zones where the small surface area wafers 200b are not arranged. That is, in the present embodiments, the second and third zones where the small surface area wafers 200b are arranged are defined as a second supply region, and the first zone where only the large surface area wafers 200a are arranged is defined as a first supply region.

In the present embodiments, in step A, flow rate control is performed so that the flow rate (second supply region flow rate) per unit length in the arrangement direction of the wafers 200 of the $N_2$ gas supplied from the nozzles 249d (Rc) and 249e (Rb) becomes larger than the flow rate (the first supply region flow rate) per unit length in the arrangement direction of the wafers 200 of the $N_2$ gas supplied from the nozzle 249c (Rt).

More specifically, the flow rates of the $N_2$ gas supplied from Rt to Rb are respectively controlled so that the concentration of the HCDS gas in the second supply region (second and third zones) becomes closer to, and more preferably, becomes substantially equal to the concentration (partial pressure) of the HCDS gas in the first supply region (first zone). As an example of the flow rate of the $N_2$ gas supplied from Rt to Rb in step A (the total flow rate of the $N_2$ gas for each nozzle), the flow rate for Rt is 0 slm, the flow rate for Rc is 1.0 slm, and the flow rate for Rb is 1.0 slm. Furthermore, as in the first embodiments, a small amount of $N_2$ gas may be supplied from Rt without omitting the supply of the $N_2$ gas from Rt. For example, the supply flow rate of the $N_2$ gas from Rt (first supply region flow rate) may be 0.1 slm.

In the present embodiments, a region where the large surface area wafer 200a is not arranged exists above the first zone. If the HCDS gas flows into such a region, a non-consumed HCDS gas may go around into the first zone, thereby increasing the concentration of the HCDS gas in the first zone. Therefore, a small amount of $N_2$ gas as a dilution gas may be supplied to the first zone in consideration of such going-around of the HCDS gas. For example, the supply flow rate of the $N_2$ gas from Rt may be 0.2 slm.

Figure 6:
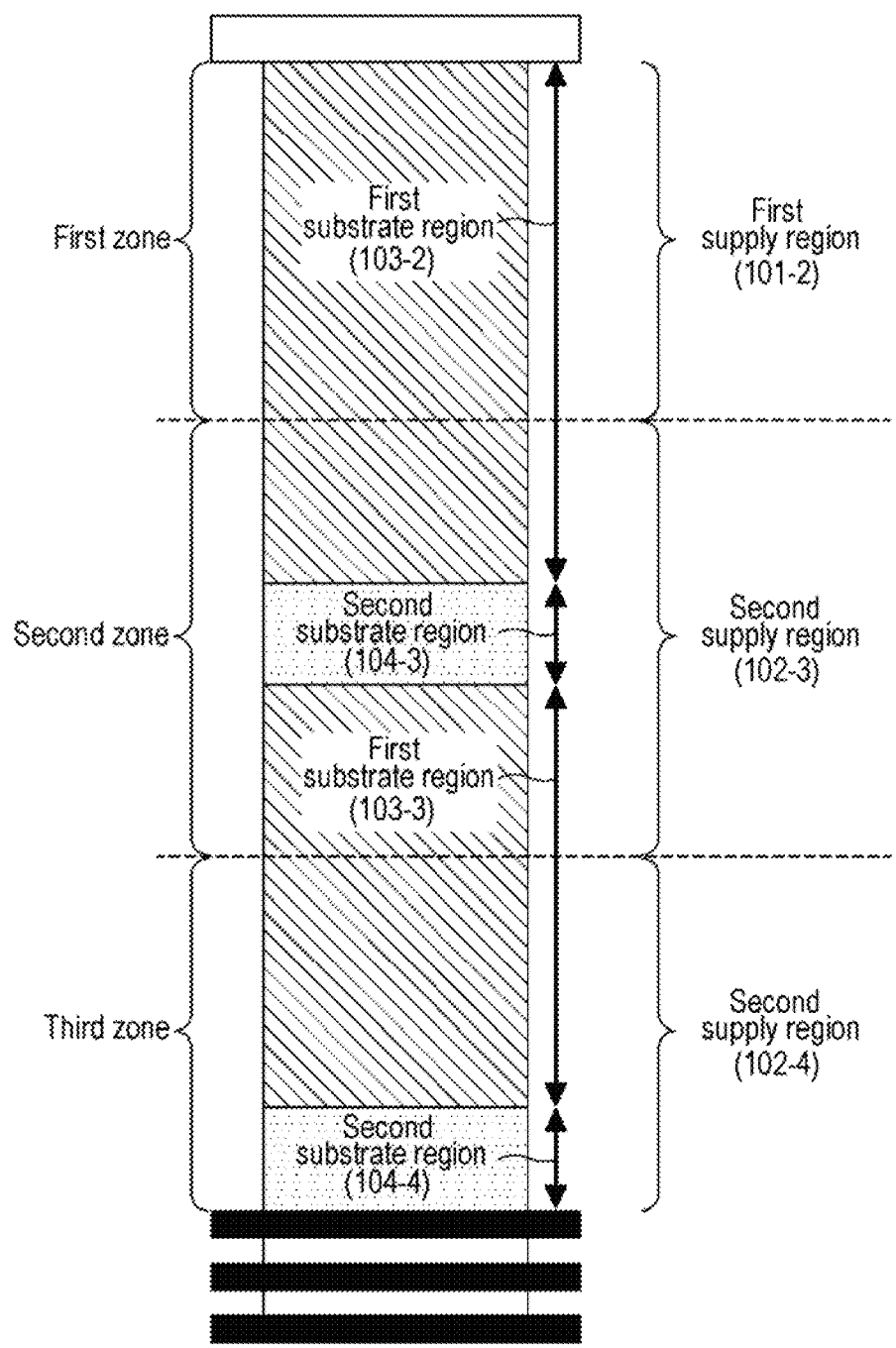
FIG. 6 is a diagram showing an arrangement state of wafers in other embodiments of the present disclosure.

According to the present embodiments, the same effects as in the first embodiments may be obtained even with the arrangement of the wafers 200 as shown in FIG. 6.

Third Embodiments

Next, an example in which the wafers 200 are charged and processed in the arrangement shown in FIG. 7, which is different from the first embodiments, will be described as third embodiments.

In the present embodiments, ten small surface area wafers 200b are charged at the central portion of the second zone. Furthermore, a total of 110 large surface area wafers 200a are charged at the entire first and third zones and at the region of the second zone where the small surface area wafers 200b are not arranged.

That is, in the present embodiments, the second zone in which the small surface area wafers 200b are arranged is defined as a second supply region, and the first and third zones in which only the large surface area wafers 200a are arranged are defined as a first supply region. In step A, flow rate control is performed so that the flow rate (second supply region flow rate) per unit length in the arrangement direction of the wafers 200 of the $N_2$ gas supplied from the nozzle 249d (Rc) becomes larger than the flow rate (the first supply region flow rate) per unit length in the arrangement direction of the wafers 200 of the $N_2$ gas supplied from the nozzles 249c (Rt) and 249e (Bb).

For example, the flow rates of the $N_2$ gas supplied from Rt to Rb are respectively controlled so that the concentration (partial pressure) of the HCDS gas in the second supply region (second zone) becomes closer to, and more preferably, becomes substantially equal to the concentration (partial pressure) of the HCDS gas in the first supply region (first and third zones). As an example of the flow rate of the $N_2$ gas supplied from Rt to Rb in step A (the total flow rate of the $N_2$ gas for each nozzle), the flow rate for Rt is 0 slm, the flow rate for Rc is 1.0 slm, and the flow rate for Rb is 0 slm. Furthermore, as in the first embodiments, a small amount of $N_2$ gas may be supplied from Rt and Rb without omitting the supply of the $N_2$ gas from Rt and Rb. For example, each of the supply flow rates of the $N_2$ gas from Rt and Rb (first supply region flow rates) may be 0.1 slm.

In the present embodiments, a region where the large surface area wafer 200a is not arranged exists above the first zone and below the third zone. If the HCDS gas flows into such a region, a non-consumed HCDS gas may go around into the first and third zones, thereby increasing the concentration of the HCDS gas in the first and third zones. Therefore, a small amount of $N_2$ gas as a dilution gas may be supplied to the first and third zones in consideration of such going-around of the HCDS gas. For example, each of the supply flow rates of the $N_2$ gas from Rt and Rb may be 0.2 slm.

Figure 7:
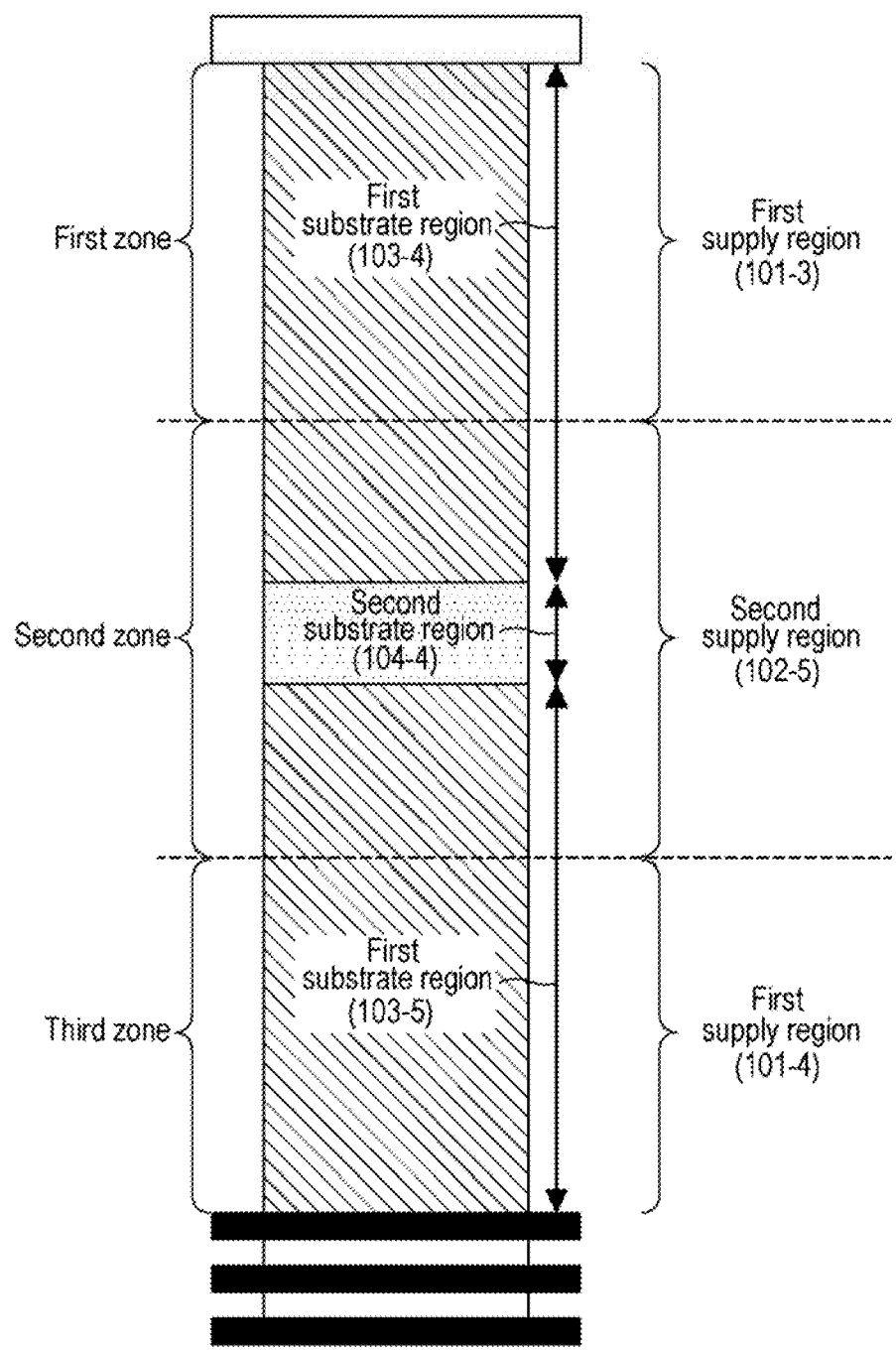
FIG. 7 is a diagram showing an arrangement state of wafers in further embodiments of the present disclosure.

According to the present embodiments, the same effects as in the first embodiments may be obtained even with the arrangement of the wafers 200 as shown in FIG. 7.

Fourth Embodiments

Next, an example in which the wafers 200 are charged and processed in the arrangement shown in FIG. 8, which is different from the first embodiments, will be described as fourth embodiments.

Figure 8:
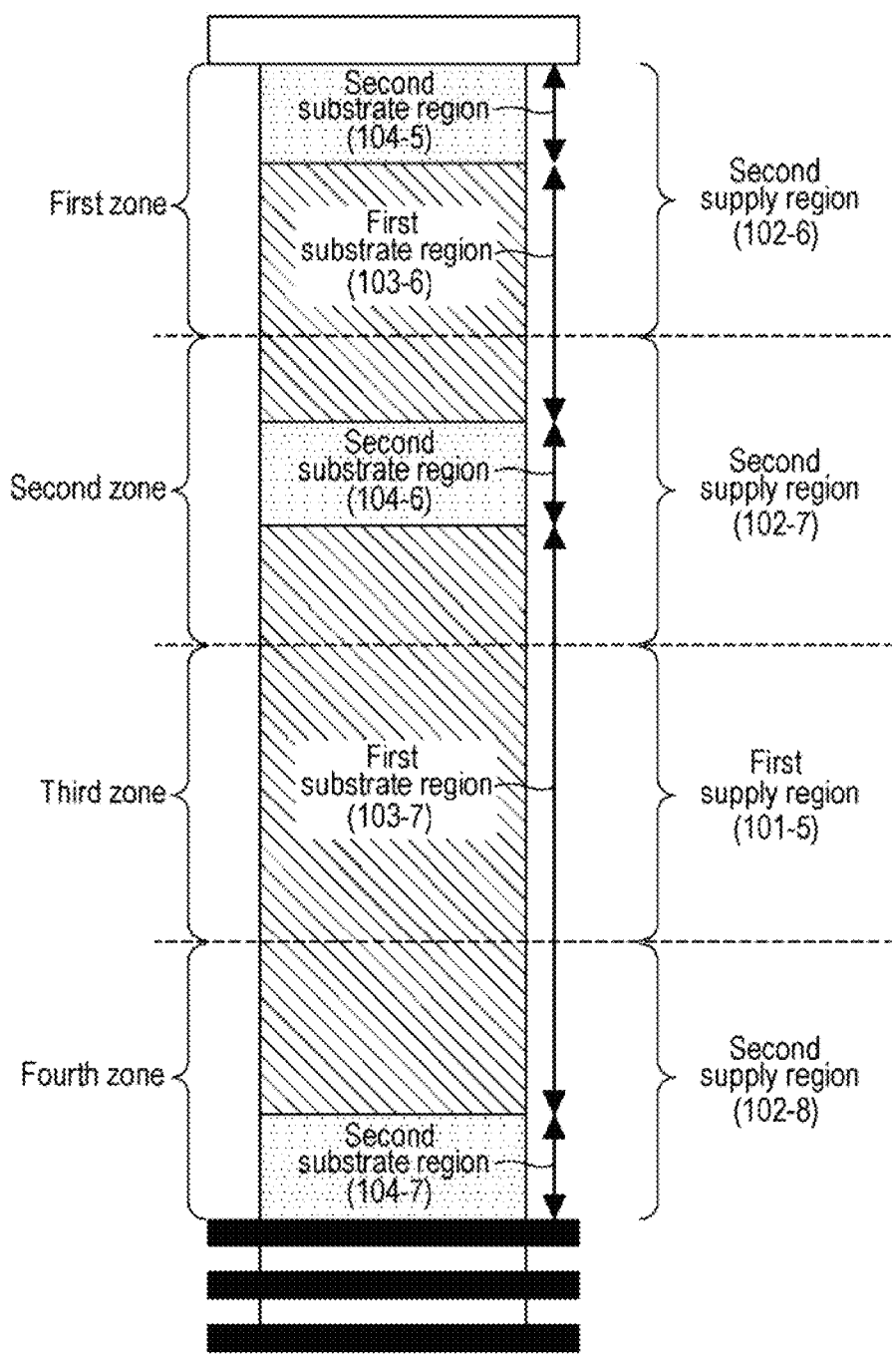
FIG. 8 is a diagram showing an arrangement state of wafers in still further embodiments of the present disclosure.

In the present embodiments, as shown in FIG. 8, the wafer arrangement region is divided into first to fourth zones from the upper side to the lower side. Ten small surface area wafers 200b are charged at each of the first zone, the second zone, and the fourth zone. A total of 90 large surface area wafers 200a are charged at the entire third zone and at the regions of the first, second, and fourth zones where the small surface area wafers 200b are not arranged. That is, in the present embodiments, the first zone, the second zone, and the fourth zone in which the small surface area wafers 200b are arranged are defined as a second supply region, and the third zone in which only the large surface area wafers 200a are arranged is defined as a first supply region.

Figure 10:
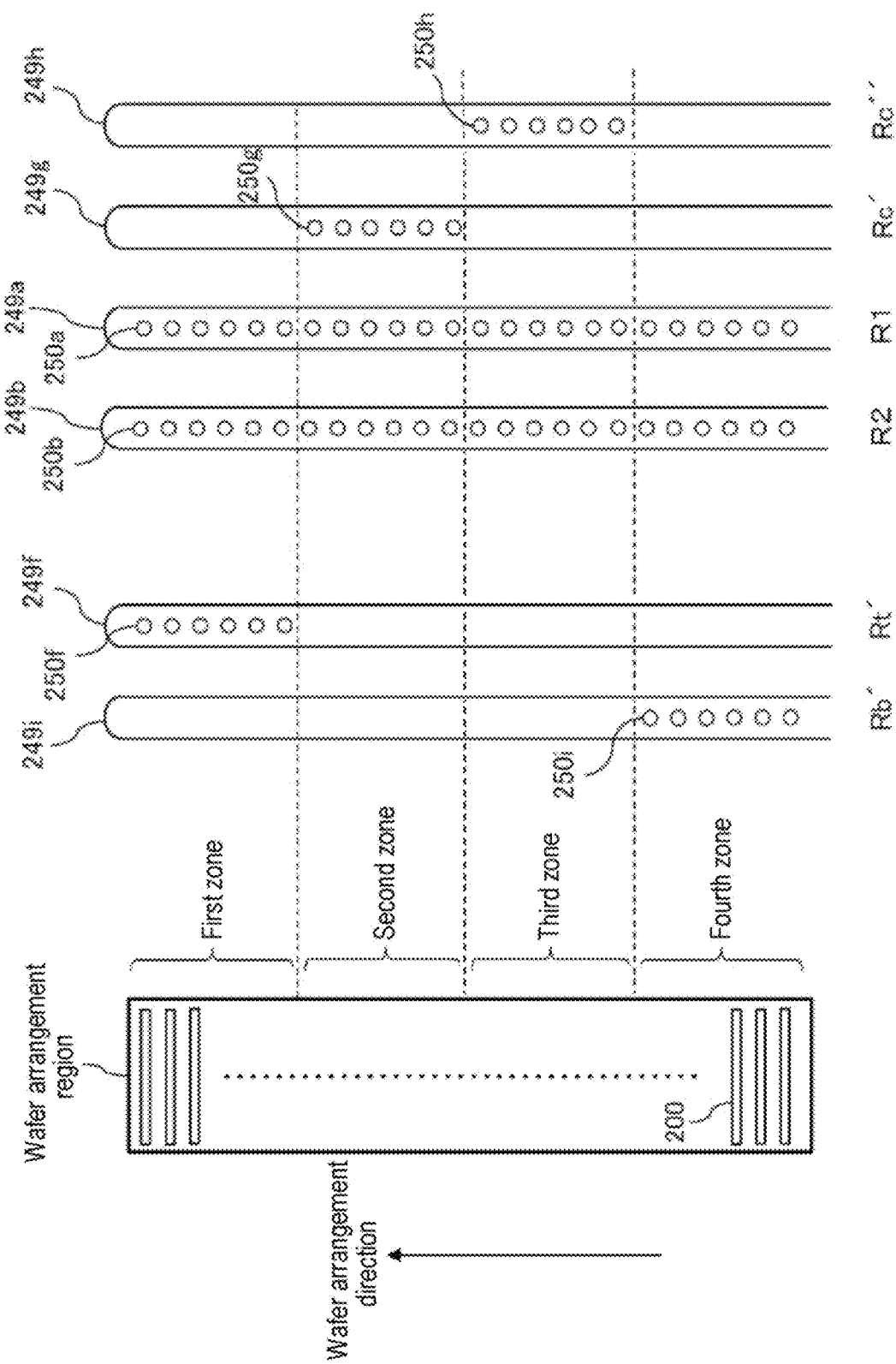
FIG. 10 is a schematic configuration diagram of nozzles suitably used in other embodiments of the present disclosure.

Furthermore, the substrate processing apparatus used in the present embodiments includes nozzles 249f to 249i as shown in FIG. 10 instead of the nozzles 249c to 249e of the substrate processing apparatus used in the first to third embodiments. Gas discharge holes 250f to 250i as sixth to ninth gas supply holes are installed at the side surfaces of the nozzles 249f to 249i, respectively.

The gas discharge holes 250f of the nozzle 249f are formed only at a portion of the nozzle 249f so as to correspond to the first zone of the wafer arrangement region. The nozzle 249f, i.e., Rt', is configured to supply a gas to the first zone, and not to perform supply of a gas to other zones, i.e., the second to fourth zones.

The gas discharge holes 250g of the nozzle 249g are formed only at a portion of the nozzle 249g so as to correspond to the second zone of the wafer arrangement region. The nozzle 249g, i.e., Rc', is configured to supply a gas to the second zone, and not to perform supply of a gas to other zones, i.e., the first, third, and fourth zones.

The gas discharge holes 250h of the nozzle 249h are formed only at a portion of the nozzle 249h so as to correspond to the third zone of the wafer arrangement region. The nozzle 249h, i.e., Rc'', is configured to supply a gas to the third zone, and not to perform supply of a gas to other zones, i.e., the first, second, and fourth zones.

The gas discharge holes 250i of the nozzle 249i are formed only at a portion of the nozzle 249i so as to correspond to the fourth zone of the wafer arrangement region. The nozzle 249i, i.e., Rb', is configured to supply a gas to the fourth zone, and not to perform supply of a gas to other zones, i.e., the first to third zones.

As the gas discharge holes 250c to 250e, the gas discharge holes 250f to 250i are opened so as to face the center of the process chamber 201, and are configured to supply a gas toward the centers of the wafers 200. The gas discharge holes 250f to 250i have the same opening area and are installed at the same opening pitch.

In step A, flow rate control is performed so that the flow rate (second supply region flow rate) per unit length in the arrangement direction of the wafers 200 of the $N_2$ gas supplied from Rt', Rc', and Rb' becomes larger than the flow rate (the first supply region flow rate) per unit length in the arrangement direction of the wafers 200 of the $N_2$ gas supplied from Rc''.

Furthermore, the flow rates of the $N_2$ gas supplied from Rt', Rc', Rc'', and Rb' are respectively controlled so that the concentration (partial pressure) of the HCDS gas in the second supply region (first, second, and fourth zones) becomes closer to, and more preferably, becomes substantially equal to the concentration (partial pressure) of the HCDS gas in the first supply region (third zone). As an example of the flow rate of the $N_2$ gas supplied from Rt', Rc', Rc'', and Rb' in step A (the total flow rate of the $N_2$ gas for each nozzle), the flow rate for Rt' is 0.8 slm, the flow rate for Rc' is 0.7 slm, the flow rate for Rc'' is 0.1 slm, and the flow rate for Rb' is 0.8 slm. Furthermore, as in the first embodiments, a small amount of $N_2$ gas may be supplied from Rc'' without omitting the supply of the $N_2$ gas from Rc''. For example, the supply flow rate of the $N_2$ gas from Rc'' (first supply region flow rate) may be 0.1 slm.

According to the present embodiments, the same effects as in the first embodiments may be obtained even with the arrangement of the wafers 200 as shown in FIG. 8.

Other Embodiments

The embodiments of the present disclosure have been specifically described above. However, the present disclosure is not limited to the above-described embodiments, and may be variously changed without departing from the spirit thereof.

For example, silicon oxide films (SiO films) may be formed on the substrates by the following film-forming sequences using an O-containing gas such as an $O_2$ gas, an $O_3$ gas, or the like, a H-containing gas such as a $H_2$ gas or the like, and the like as reactants. In these cases, the same effects as in the above-described embodiments may be obtained. The processing procedures and processing conditions when supplying these reactants may be, for example, the same as those when supplying the reactants in the above-described embodiments.

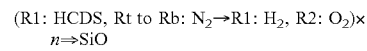
(R1: HCDS, Rt to Rb: $N_2 \rightarrow$ R1: $H_2$, R2: $O_2$)×
$n \Rightarrow$ SiO

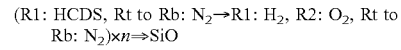
(R1: HCDS, Rt to Rb: $N_2 \rightarrow$ R1: $H_2$, R2: $O_2$, Rt to Rb: $N_2$)×$n \Rightarrow$ SiO Furthermore, for example, a SiON film, a silicon oxycarbide film (SiOC film), a silicon oxycarbonitride film (SiOCN film) and the like may be formed on the substrates by the following film-forming sequences using, as reactants, a N-containing gas such as an $NH_3$ gas or the like, a carbon (C)-containing gas such as a propylene ($C_3H_6$) gas or the like, and a N- and C-containing gas such as a triethylamine ((C$_2$H$_5$)$_3$N, abbreviation: TEA) gas or the like, and the like. Even in these cases, the same effects as in the above-described embodiments may be obtained. The processing procedures and processing conditions when supplying these reactants may be, for example, the same as those when supplying the reactants in the above-described embodiments.

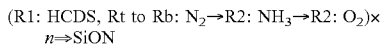
n⇒SiON

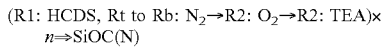
n⇒SiOC(N)

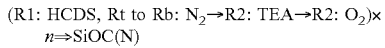
n⇒SiOC(N)

(R1: HCDS, Rt to Rb: N$_2$→R2: C$_3$H$_6$→R2: NH$_3$→R2: O$_2$)×n⇒SiOCN (R1: HCDS, Rt to Rb: N$_2$→R2: C$_3$H$_6$→R2: O$_2$→R2: NH$_3$)×n⇒SiOCN

Furthermore, for example, a titanium oxynitride film (TiON film), an aluminum oxynitride film (AlON film), and the like may be formed on the substrates by the following film-forming sequence using, as precursors, a titanium tetrachloride (TiCl$_4$) gas, a trimethylaluminum (Al(CH$_3$)$_3$, abbreviation: TMA) gas, and the like. Even in these cases, the same effects as in the above-described embodiments may be obtained. The processing procedures and processing conditions when supplying these precursors or reactants may be, for example, the same as those when supplying the precursors or reactants in the above-described embodiments.

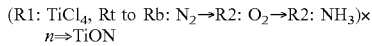
n⇒TiON

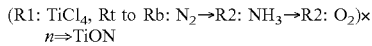
n⇒TiON

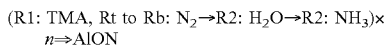
n⇒AlON

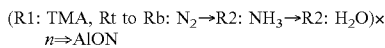
n⇒AlON

In the above-described embodiments, there has been shown the example in which the wafer arrangement region is divided into three or four zones, and the dilution gas is individually supplied to the respective zones by using three or four nozzles including gas discharge holes corresponding to the respective zones. However, the present disclosure is not limited to the above-described embodiments. For example, the wafer arrangement region may be divided into five or more zones, and the dilution gas may be individually supplied to the respective zones by using five or more nozzles including gas discharge holes corresponding to the respective zones.

Furthermore, in the above-described embodiments, there has been shown the example in which the wafer arrangement region is divided into a plurality of zones so that the lengths in the arrangement direction of the wafers 200 are approximately equal to each other, and the operations of supplying the dilution gas to the respective zones are individually controlled. However, the present disclosure is not limited to the above-described embodiments. The length of each zone (the number of wafers included in each zone) may be set arbitrarily. For example, the zones at the upper and lower sides of the wafer arrangement region may be set to become narrower than other zones.

The various embodiments described above may be used in appropriate combinations. The processing procedures and processing conditions at this time may be, for example, the same as the processing procedures and processing conditions of the above-described embodiments.

[Example]

Hereinafter, a Reference Example and an Example will be described. In the Reference Example and the Example, a SiO film was formed on each of wafers by performing a cycle 100 times using the substrate processing apparatus shown in FIG. 1, the cycle including non-simultaneously supplying a HCDS gas, an O$_2$ gas, and a H$_2$ gas to each of the wafers in this order. The arrangement of the wafers 200 (the large surface area wafers 200a and the small surface area wafers 200b) charged to the boat 217 was the same as that in the first embodiments (i.e., the arrangement shown in FIG. 5).

The substrate processing apparatus according to the above-described embodiments is configured to supply the HDC5 gas from the gas supply pipe 232a, the O$_2$ gas from the gas supply pipe 232b, and the NH$_3$ gas from the gas supply pipe 232f. However, in the Reference Example and the Example, there was used a substrate processing apparatus configured to supply a HDCS gas from the gas supply pipe 232b instead of the gas supply pipe 232a, an O$_2$ gas from the gas supply pipe 232a instead of the gas supply pipe 232b, and a H$_2$ gas from the gas supply pipe 232f.

(Reference Example)

In the Reference Example, in the step of supplying the HCDS gas, the supply of the N$_2$ gas from Rt to Rb described in the above embodiments was not performed. The processing conditions in the step of supplying the HCDS gas (step A') and the step of supplying the O$_2$ gas and the H$_2$ gas (step B') were as follows.

[Step A']
HCDS gas supply flow rate: 0.1 slm
HCDS gas supply time: 4 seconds
Processing pressure: 399 Pa
N$_2$ gas supply flow rate (for each of Rt, Rc, and Rb): 0 slm
[Step B']
O$_2$ gas supply flow rate: 3.5 slm
H$_2$ gas supply flow rate: 2.0 slm
O$_2$ gas/H$_2$ gas supply time: 6 seconds
Processing pressure: 40 Pa
N$_2$ gas supply flow rate (for each of Rt, Rc, and Rb): 0 slm
(Example)

On the other hand, in the Example, in the step of supplying the HCDS gas (step A') and the step of supplying the O$_2$ gas and the H$_2$ gas (step B'), as in the first embodiments described above, the supply of the N$_2$ gas from Rt and Rb is was performed, and the supply of the N$_2$ gas from Rc was not performed. The processing conditions in step A' and step B' were as follows.

Figure 11:
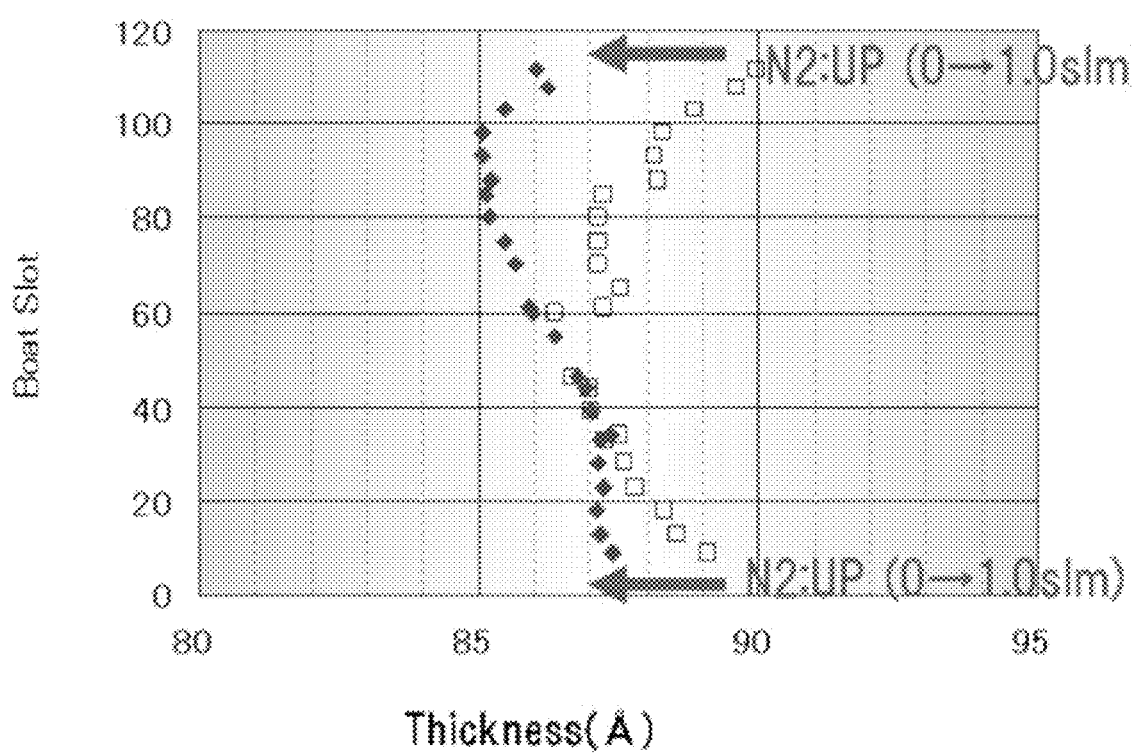
FIG. 11 is a diagram showing measurement results of the thicknesses of oxide films formed on substrates in a Reference Example and an Example.

[Step A']
HCDS gas supply flow rate: 0.1 slm
HCDS gas supply time: 4 seconds
Processing pressure: 399 Pa
N$_2$ gas supply flow rate (for each of Rt and Rb): 1.0 slm
N$_2$ gas supply flow rate (for Rc): 0 slm
[Step B']
O$_2$ gas supply flow rate: 3.5 slm
H$_2$ gas supply flow rate: 2.0 slm
O$_2$ gas/H$_2$ gas supply time: 6 seconds
Processing pressure: 40 Pa
N$_2$ gas supply flow rate (for each of Rt, Rc, and Rb): 0 slm FIG. 11 is a view showing the measurement results of the relationships between the positions of the large surface area wafers 200a in the wafer arrangement region (the slot number in the boat 217) and the thicknesses of the SiO films formed on the large surface area wafers 200a arranged at the respective positions in the Reference Example and the Example. In FIG. 11, the horizontal axis indicates the thicknesses (A) of the SiO films formed on the wafers, and the vertical axis indicates the positions of the large surface area wafers 200a in the wafer arrangement region. Furthermore, "120" on the vertical axis indicates the upper end of the wafer arrangement region, and "0" indicates the lower end of the wafer arrangement region. In addition, the points plotted with squares indicate the measurement results of the Reference Example, and the points plotted with diamonds indicate the measurement results of the Example.

Referring to FIG. 11, it can be noted that in the Reference Example, the thickness of the SiO film formed on each of the large surface area wafers 200a in the first and third zones in which the small surface area wafers 200b are arranged (i.e., which include the second substrate region) is larger than the thickness of the SiO film formed on each of the large surface area wafers 200a in the second zone in which the small surface area wafers 200b are not arranged (i.e., which does not include the second substrate region). That is, it can be seen that the thickness of the SiO film formed on the surface of each of the large surface area wafers 200a varies between the large surface area wafers 200a in the second zone and the large surface area wafers 200a in the first and third zones.

On the other hand, referring to FIG. 11, it can be noted that in the Example, the thickness of the SiO film formed on each of the large surface area wafers 200a in the first and third zones becomes closer to the thickness of the SiO film formed on each of the large surface area wafers 200a in the second zone. That is, it can be seen that, between the large surface area wafers 200a in the second zone and the large surface area wafers 200a in the first and third zones, the inter-substrate uniformity of the thicknesses of the SiO films formed on the surfaces of the large surface area wafers 200a is improved as compared with the Reference Example.

As described above, in the Example, the $N_2$ gas as a dilution gas is individually supplied to the first and third zones including the second substrate region, and the $N_2$ gas is not supplied to the second zone not including the second substrate region, whereby the concentration of the HCDS gas in the first and third zones can be adjusted so as to become closer to the concentration of the HCDS gas in the second zone.

According to the present disclosure in some embodiments, it is possible to control the inter-substrate thickness distribution of thin films formed on a plurality of substrates.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
   (a) arranging a plurality of first substrates and a second substrate having a smaller surface area than the first substrates in a direction perpendicular to a surface direction and accommodating the plurality of first substrates and the second substrate in a process chamber; and
   (b) forming a thin film on each of the plurality of first substrates by supplying a processing gas to a substrate arrangement region in which the plurality of first substrates and the second substrate are arranged, wherein (b) includes:
      (c) supplying a dilution gas to a first supply region, which includes a region where at least a part of the plurality of first substrates are arranged and does not include a region where the second substrate is arranged, of the substrate arrangement region, or not performing a supply of the dilution gas to the first supply region, and
      supplying the dilution gas to at least one second supply region, which is a region other than the first supply region and includes the region where the second substrate is arranged, of the substrate arrangement region from a dilution gas nozzle, which is different from a processing gas nozzle configured to supply the processing gas, at a flow rate larger than a flow rate of the dilution gas supplied to the first supply region, and
   wherein the dilution gas nozzle does not include a gas discharge hole formed at a position corresponding to the first supply region, and includes a gas discharge hole formed at a position corresponding to the at least one second supply region.

2. The method of claim 1, wherein in (b), the processing gas is supplied to both the first supply region and the at least one second supply region.

3. The method of claim 1, wherein in (c), the supply of the dilution gas to the first supply region is not performed.

4. The method of claim 1, wherein in (c), at least one selected from the group of a flow rate of the dilution gas supplied to the first supply region and a flow rate of the dilution gas supplied to the at least one second supply region is adjusted so that a concentration of the processing gas in the at least one second supply region becomes closer to a concentration of the processing gas in the first supply region.

5. The method of claim 1, wherein in (c), at least one selected from the group of a flow rate of the dilution gas supplied to the first supply region and a flow rate of the dilution gas supplied to the at least one second supply region is adjusted so that a thickness of the thin film formed on each of the plurality of first substrates arranged in the at least one second supply region becomes closer to a thickness of the thin film formed on each of the plurality of first substrates arranged in the first supply region.

6. The method of claim 1, wherein the at least one second supply region includes a plurality of second supply regions, and the substrate arrangement region includes the plurality of second supply regions, and
wherein in (c), the dilution gas is individually supplied to the plurality of second supply regions from a plurality of dilution gas nozzles installed such that each of the plurality of dilution gas nozzles respectively corresponds to each of the plurality of second supply regions.

7. The method of claim 6, wherein in (c), flow rates of the dilution gas supplied to the plurality of second supply regions are individually adjusted.

8. The method of claim 1, wherein the processing gas nozzle is configured to supply the processing gas to both the first supply region and the at least one second supply region.

9. The method of claim 1, wherein (b) further includes performing a cycle a predetermined number of times, the cycle including non-simultaneously performing:
(d) supplying a precursor gas to the substrate arrangement region; and
(e) supplying a reaction gas to the substrate arrangement region, and
wherein (c) is performed in (d).

10. The method of claim 1, wherein the substrate arrangement region includes at least a first zone on a first end of the substrate arrangement region, a second zone on a central portion of the substrate arrangement region, and a third zone on a second end of the substrate arrangement region,
wherein the second zone corresponds to the first supply region, and the first zone and the third zone correspond to the at least one second supply region, and
wherein in (c), the dilution gas is supplied toward the first zone from a first dilution gas nozzle installed so as to correspond to the first zone, and the dilution gas is supplied toward the third zone from a third dilution gas nozzle installed so as to correspond to the third zone.

11. The method of claim 10, wherein in (c), a supply of the dilution gas to the second zone is not performed.

12. The method of claim 10, wherein in (c), the dilution gas is supplied toward the second zone from a second dilution gas nozzle installed so as to correspond to the second zone.

13. A non-transitory computer-readable recording medium storing a program that causes, by a computer, a substrate processing apparatus to perform a process comprising:
(a) arranging a plurality of first substrates and a second substrate having a smaller surface area than the first substrates in a direction perpendicular to a surface direction and accommodating the plurality of first substrates and the second substrate in a process chamber of the substrate processing apparatus; and
(b) forming a thin film on each of the plurality of first substrates by supplying a processing gas to a substrate arrangement region in which the plurality of first substrates and the second substrate are arranged,
wherein (b) includes:
supplying a dilution gas to a first supply region, which includes a region where at least a part of the plurality of first substrates are arranged and does not include a region where the second substrate is arranged, of the substrate arrangement region, or not performing a supply of the dilution gas to the first supply region, and
supplying the dilution gas to at least one second supply region, which is a region other than the first supply region and includes the region where the second substrate is arranged, of the substrate arrangement region from a dilution gas nozzle, which is different from a processing gas nozzle configured to supply the processing gas, at a flow rate larger than a flow rate of the dilution gas supplied to the first supply region, and
wherein the dilution gas nozzle does not include a gas discharge hole formed at a position corresponding to the first supply region, and includes a gas discharge hole formed at a position corresponding to the at least one second supply region.

14. A method of processing a substrate, comprising:
(a) arranging a plurality of first substrates and a second substrate having a smaller surface area than the first substrates in a direction perpendicular to a surface direction and accommodating the plurality of first substrates and the second substrate in a process chamber; and
(b) forming a thin film on each of the plurality of first substrates by supplying a processing gas to a substrate arrangement region in which the plurality of first substrates and the second substrate are arranged,
wherein (b) includes:
(c) supplying a dilution gas to a first supply region, which includes a region where at least a part of the plurality of first substrates are arranged and does not include a region where the second substrate is arranged, of the substrate arrangement region, or not performing a supply of the dilution gas to the first supply region, and
supplying the dilution gas to at least one second supply region, which is a region other than the first supply region and includes the region where the second substrate is arranged, of the substrate arrangement region from a dilution gas nozzle, which is different from a processing gas nozzle configured to supply the processing gas, at a flow rate larger than a flow rate of the dilution gas supplied to the first supply region, and
wherein the dilution gas nozzle does not include a gas discharge hole formed at a position corresponding to the first supply region, and includes a gas discharge hole formed at a position corresponding to the at least one second supply region.

* * * * *